United States Patent
Sonderegger

(10) Patent No.: US 10,571,493 B2
(45) Date of Patent: Feb. 25, 2020

(54) SMART GRID TOPOLOGY ESTIMATOR

(71) Applicant: Itron, Inc., Liberty Lake, WA (US)

(72) Inventor: Robert Sonderegger, Oakland, CA (US)

(73) Assignee: Itron, Inc., Liberty Lake, WA (US)

(*) Notice: Subject to any disclaimer, the term of this patent is extended or adjusted under 35 U.S.C. 154(b) by 0 days.

(21) Appl. No.: 14/280,286

(22) Filed: May 16, 2014

(65) Prior Publication Data

US 2015/0241482 A1 Aug. 27, 2015

Related U.S. Application Data

(60) Provisional application No. 61/944,551, filed on Feb. 25, 2014.

(51) Int. Cl.
| | |
|---|---|
| *G01R 19/00* | (2006.01) |
| *G06Q 10/06* | (2012.01) |
| *G06Q 50/06* | (2012.01) |

(52) U.S. Cl.
CPC ....... *G01R 19/003* (2013.01); *G01R 19/0084* (2013.01); *G06Q 10/06* (2013.01); *G06Q 50/06* (2013.01)

(58) Field of Classification Search
CPC .. G01R 19/003; G01R 19/0084; G06Q 50/06; G06Q 10/06
USPC .............................................. 324/142; 702/65
See application file for complete search history.

(56) References Cited

U.S. PATENT DOCUMENTS

| | | | |
|---|---|---|---|
| 4,146,841 | A | 3/1979 | McRae |
| 4,532,471 | A | 7/1985 | Hurley |
| 4,930,064 | A | 5/1990 | Tanaka et al. |
| 5,184,119 | A | 2/1993 | Stanbury et al. |

(Continued)

FOREIGN PATENT DOCUMENTS

| | | |
|---|---|---|
| DE | 102008044915 | 3/2010 |
| DE | 102013106393 | 12/2013 |

(Continued)

OTHER PUBLICATIONS

Translated Japanese Office Action dated Apr. 22, 2014 for Japanese patent application No. 2014-511377, a counterpart foreign application of U.S. Appl. No. 13/560,078, 6 pages.

(Continued)

*Primary Examiner* — Akm Zakaria
(74) *Attorney, Agent, or Firm* — Lee & Hayes, P.C.

(57) ABSTRACT

Techniques for determining aspects of a topology of a smart grid are described herein, and particularly for determining if one or more electrical meters are connected to the same transformer. In one example, time-stamped voltage data is collected from at least two meters. The voltage data may indicate a slight transient change in voltage resulting from a consumer turning on or off an electrical load. In particular, the slight voltage changes may be sensed by all meters attached to a same transformer based on electrical load changes by any one of the customers on the same transformer. Using the time-stamped voltage data, a time-series of voltage-changes may be generated for each electrical meter. A correlation between the time-series of voltage-changes of pairs of meters may be calculated, to thereby determine an affinity between the meters, and particularly if they are connected to a same transformer.

18 Claims, 12 Drawing Sheets

(56) References Cited

U.S. PATENT DOCUMENTS

| | | |
|---|---|---|
| 5,617,329 A | 4/1997 | Allison et al. |
| 5,673,196 A | 9/1997 | Hoffman et al. |
| 5,831,423 A | 11/1998 | Mancini |
| 5,920,720 A | 7/1999 | Toutonghi et al. |
| 6,334,050 B1 | 12/2001 | Skarby |
| 6,456,097 B1 | 9/2002 | Sutherland |
| 7,272,518 B2 | 9/2007 | Bickel et al. |
| 7,523,185 B1 | 4/2009 | Ng et al. |
| 7,583,197 B2 | 9/2009 | Wesby Van Swaay |
| 7,936,163 B2 | 5/2011 | Lee, Jr. |
| 8,094,010 B2 | 1/2012 | Wesby-van Swaay |
| 8,283,911 B1 | 10/2012 | Bierer |
| 8,301,386 B1 | 10/2012 | Redmond et al. |
| 8,407,016 B2 | 3/2013 | Slota et al. |
| 8,639,391 B1 | 1/2014 | Alberth, Jr. et al. |
| 8,797,018 B2 | 8/2014 | Watkins et al. |
| 9,031,800 B2 | 5/2015 | Filippenko et al. |
| 9,230,429 B2 | 1/2016 | McKinley et al. |
| 9,924,242 B2 | 3/2018 | Van Wyk |
| 2005/0063317 A1 | 3/2005 | Risberg et al. |
| 2005/0177646 A1 | 8/2005 | Kawano et al. |
| 2006/0071776 A1 | 4/2006 | White, II et al. |
| 2006/0167981 A1 | 7/2006 | Bansod et al. |
| 2007/0247331 A1 | 10/2007 | Angelis et al. |
| 2008/0089390 A1 | 4/2008 | Picard |
| 2009/0045976 A1 | 2/2009 | Zoldi et al. |
| 2009/0058088 A1 | 3/2009 | Pitchford et al. |
| 2009/0276170 A1* | 11/2009 | Bickel ............... H02J 3/00 702/58 |
| 2009/0299660 A1 | 12/2009 | Winter |
| 2010/0002348 A1* | 1/2010 | Donolo ............... H02H 7/261 361/64 |
| 2010/0007336 A1 | 1/2010 | de Buda |
| 2010/0060259 A1 | 3/2010 | Vaswani et al. |
| 2010/0088431 A1 | 4/2010 | Oshins et al. |
| 2010/0134089 A1 | 6/2010 | Uram et al. |
| 2010/0142447 A1 | 6/2010 | Schlicht et al. |
| 2010/0179704 A1 | 7/2010 | Ozog |
| 2011/0116387 A1 | 5/2011 | Beeco et al. |
| 2011/0122798 A1 | 5/2011 | Hughes et al. |
| 2011/0126176 A1 | 5/2011 | Kandasamy et al. |
| 2011/0215945 A1 | 9/2011 | Peleg et al. |
| 2011/0254525 A1 | 10/2011 | Gaknoki et al. |
| 2012/0041696 A1* | 2/2012 | Sanderford, Jr. ...... G01D 4/004 702/62 |
| 2012/0062210 A1 | 3/2012 | Veillette |
| 2012/0117392 A1 | 5/2012 | Turicchi, Jr. et al. |
| 2012/0126636 A1 | 5/2012 | Atsumi |
| 2012/0169300 A1* | 7/2012 | Rouaud ............... H02J 3/1835 323/207 |
| 2012/0181974 A1 | 7/2012 | Kuniyosi et al. |
| 2012/0198037 A1 | 8/2012 | Shelby et al. |
| 2012/0201195 A1 | 8/2012 | Rausch et al. |
| 2012/0229089 A1* | 9/2012 | Bemmel ............... H02J 7/0013 320/109 |
| 2013/0024149 A1 | 1/2013 | Nayar et al. |
| 2013/0035885 A1 | 2/2013 | Sharon et al. |
| 2013/0076534 A1 | 3/2013 | Conant et al. |
| 2013/0101003 A1 | 4/2013 | Vedantham et al. |
| 2013/0110425 A1 | 5/2013 | Sharma et al. |
| 2013/0241746 A1 | 9/2013 | McKinley et al. |
| 2013/0242867 A1 | 9/2013 | Bell |
| 2013/0275736 A1 | 10/2013 | Kelley et al. |
| 2013/0278437 A1 | 10/2013 | Wyk |
| 2013/0335062 A1* | 12/2013 | de Buda ............... G01R 21/00 324/142 |
| 2014/0005964 A1* | 1/2014 | Rouaud ............... G01D 4/00 702/61 |
| 2014/0012524 A1* | 1/2014 | Flammer, III ............ H02J 3/00 702/60 |
| 2014/0032506 A1 | 1/2014 | Hoey et al. |
| 2014/0039818 A1 | 2/2014 | Arya et al. |
| 2014/0049109 A1 | 2/2014 | Kearns et al. |
| 2014/0074670 A1 | 3/2014 | Garrity et al. |
| 2014/0161114 A1 | 6/2014 | Shuey |
| 2014/0173600 A1 | 6/2014 | Ramakrishnan Nair |
| 2014/0214218 A1* | 7/2014 | Eldridge ............... G01D 4/002 700/286 |
| 2014/0236506 A1 | 8/2014 | Nikovski et al. |
| 2014/0330955 A1 | 11/2014 | Bishop et al. |
| 2014/0337429 A1 | 11/2014 | Asenjo et al. |
| 2014/0358839 A1 | 12/2014 | Dhurandhar et al. |
| 2014/0368189 A1 | 12/2014 | Bernheim et al. |
| 2014/0379303 A1 | 12/2014 | Chandrashekaraiah et al. |
| 2015/0052088 A1 | 2/2015 | Arya et al. |
| 2015/0103672 A1 | 4/2015 | Stuart |
| 2015/0200713 A1 | 7/2015 | Hui et al. |
| 2015/0241488 A1 | 8/2015 | Sonderegger |
| 2015/0253367 A1 | 9/2015 | Flammer, III et al. |
| 2015/0280782 A1 | 10/2015 | Airbinger et al. |
| 2016/0109491 A1 | 4/2016 | Kann |
| 2016/0109497 A1 | 4/2016 | Aiello et al. |
| 2016/0142514 A1 | 5/2016 | Stuber et al. |
| 2016/0154040 A1 | 6/2016 | Driscoll et al. |
| 2016/0173237 A1 | 6/2016 | Braun et al. |
| 2016/0352103 A1 | 12/2016 | Aiello et al. |
| 2017/0168098 A1 | 6/2017 | Aiello et al. |
| 2018/0156851 A1 | 6/2018 | Driscoll et al. |
| 2018/0213304 A1 | 7/2018 | Van Wyk |

FOREIGN PATENT DOCUMENTS

| | | |
|---|---|---|
| EP | 1460801 | 9/2004 |
| GB | 2426596 | 11/2006 |
| JP | 06273200 | 9/1994 |
| JP | 2000175358 | 6/2000 |
| JP | 2000249730 | 9/2000 |
| JP | 2004340767 | 12/2004 |
| JP | 2012016270 | 1/2012 |
| JP | 2012058233 | 3/2012 |
| JP | 2012521596 | 9/2012 |
| JP | 2014079138 | 5/2014 |
| JP | 2015076994 | 4/2015 |
| JP | 2015107012 | 6/2015 |
| WO | WO2007063180 | 6/2007 |
| WO | WO2009061291 | 5/2009 |
| WO | WO2010105038 | 9/2010 |
| WO | WO2010110787 | 9/2010 |
| WO | WO2014124318 | 8/2014 |

OTHER PUBLICATIONS

Final Office Action for U.S. Appl. No. 13/560,078, dated Jul. 1, 2015, Hartman Van Wyk, "Automatic Network Topology Detection and Fraud Detection", 23 pages.

The Extended European Search Report dated Sep. 6, 2012 for European patent application No. 12165026.1, 6 pages.

Office action for U.S. Appl. No. 13/560,078, dated Dec. 16, 2013, Van Wyk, "Automatic Network Topology Detection and Fraud Detection", 23 pages.

Office action for U.S. Appl. No. 13/560,078 , dated Aug. 15, 2013, Van Wyk, "Automatic Network Topology Detection and Fraud Detection", 16 pages.

The PCT Search Report dated Jan. 31, 2013 for PCT application No. PCT/US12/34697, 9 pages.

Office Action for U.S. Appl. No. 13/560,078, dated Feb. 13, 2015, Hartman Van Wyk, "Automatic Network Topology Detection and Fraud Detection", 22 pages.

Translated Japanese Office Action dated Oct. 28, 2014 for Japanese patent application No. 2014-511377, a counterpart foreign application of U.S. Appl. No. 13/560,078, 5 pages.

Final Office Action for U.S. Appl. No. 13/560,078, dated Oct. 6, 2014, Hartman Van Wyk, "Automatic Network Topology Detection and Fraud Detection", 34 pages.

Sharon, et al., Topology Identification in Distribution Network with Limited Measurements, Inovative Smart Grid Technology Conference, Jan. 16-20, 2012, IEEE, pp. 1-6.

Hughes, "Augmenting AMI to Radically Reduce Electricity Theft", Metering International, Issue 1, Jan. 1, 2011, pp. 80-83, retrieved

(56) References Cited

OTHER PUBLICATIONS from the internet on May 20, 2015 at http://www.metering.com/wp-content/uploads/2013/10/MI-1-2-11.pdf.
The PCT Search Report and Written Opinion dated May 22, 2015 for PCT application No. PCT/US2015/017571, 9 pages.
The PCT Search Report and Written Opinion dated Jun. 1, 2015 for PCT Application No. PCT/US2015/017575.
Short, "Advanced Metering for Phase Identification, Transformer Identification, and Secondary Modeling", IEEE Transactions on Smart Grid, IEEE, USA, vol. 4, No. 2, Jun. 1, 2013, pp. 651-658.
Handley, et al., "ComEd Corrects Meter-Transformer Mismatches" ComEd Paper, Sep. 7, 2016, 8 pages.
Moritz et al., "A CoAP based SOAP Transport Binding", IEEE Conference on Emerging Technologies and Factory Automation (ETFA'2011), Sep. 2011, 4 pages.
Office action for U.S. Appl. No. 14/547,561, dated Jul. 29, 2016, Stuber, "Application Platform Operable on Network Node", 33 pages.
The PCT Search Report and Written Opinion dated Jul. 7, 2016 for PCT application No. PCT/US2016/030144, 12 pages.
Regehr et al.,"TinyOS 2.1 Adding Threads and Memory Protection to TinyOS", proceedings of the 6th ACM conference on Embedding Network Sensor Systems (SenSys'08), Apr. 2008, 2 pages.
Snell, "Call SOAP Web services with Ajax Part 1: Build the Web services client", IBM Corporation developerWorks, Oct. 2005, 13 pages.
Berthier et al., "Intrusion detection for advanced metering infrastructures: Requirements and architectural directions", in Smart Grid Communications (SmartGridComm), 2010 First IEEE International Conference on Oct. 4, 2010, pp. 350-355.
Do, et al., "Open-Source Testing Tools for Smart Grid Communication Network", 2013 IEEE Conference on Open Systems (ICOS), Dec. 2, 2013, pp. 156-161, retrieved on Feb. 7, 2014.
"Health Device Profile", Medical Devices WG, Internet citation, Jun. 26, 2008, pp. 1-44, retrieved from the internet on Nov. 9, 2015 at URL:https://www.bluetooth.org/docman/handlers/DownloadDoc.ashx?doc_id=260864&vld=290095&_ga=1.128761092.961309788.1447059724.
Madden, et al., "TinyDB: An Acquisitional Query Processing System for Sensor Networks", ACM Transactions on Database Systems, vol. 30, No. 1, Mar. 1, 2005, pp. 122-173.
Maqousi, et al., "Towards an Open Architecture for Smart Grid Communications: Possible Pointers from Multiservice Network Research", 2013 1st International Conference & Exhibition on the Applications of Information Technology to Renewable Energy Processes and Systems, IEEE, May 29, 2013, pp. 114-118, retrieved on Aug. 29, 2013.
"Open Smart Grid Protocol (OSGP); draft ETSI GS OSG 001", European Telecommunications Standards Institute (ETSI), France, vol. zArchive—ISG, No. VO.1.2, Nov. 15, 2011, pp. 1-250, retrieved on Nov. 15, 2011.
The PCT Search Report and Written Opinion dated Jan. 28, 2016 for PCT application No. PCT/US2015/056482, 10 pages.
The PCT Search Report and Written Opinion dated Feb. 18, 2016 for PCT application No. PCT/US20165/063512, 13 page.
The PCT Search Report and Written Opinion dated Mar. 2, 2016 for PCT application No. PCT/US2015/061390, 15 pages.
The Australian Office Action dated Mar. 17, 2017 for Australian Patent Application No. 2015223145, a foreign counterpart application of U.S. Appl. No. 14/280,286, 4 pages.
Office action for U.S. Appl. No. 14/280,286, dated Mar. 17, 2017, Sonderegger, "Smart Grid Topology Estimator", 13 pages.
Office action for U.S. Appl. No. 14/558,571, dated Mar. 9, 2017, Driscoll, "Electrical Network Topology Determination", 15 pages.
Final Office action for U.S. Appl. No. 13/560,078, dated Feb. 24, 2017, Hartman et al., "Automatic Network Topology Detection and Fraud Detection", 33 pages.
The Australian Office Action dated Aug. 23, 2017 for Australian Patent Application No. 2015223053, a counterpart foreign application of U.S. Appl. No. 14/302,617, 10 pages.

The Canadian Office Action dated Oct. 26, 2016 for Canadian patent applicatoin No. 2863596, a counterpart foreign application of U.S. Appl. No. 13/560,078, 3 pages.
The Japanese Office Action dated Aug. 29, 2017 for Japanese Patent Application No. 2016-553886, a counterpart foreign application of U.S. Appl. No. 14/302,617.
The Japanese Office Action dated Sep. 12, 2017 for Japanese patent application No. 2016-553860, a counterpart foreign application of U.S. Appl. No. 14/280,286.
Keisuke Sugiura, Mitsubishi Electric Research Laboratories, Information Processing Society of Japan, 2013, pp 4-513-4-514.
Office action for U.S. Appl. No. 13/560,078, dated Feb. 24, 2017, Van Wyk, "Automatic Network Topology Detection and Fraud Detection", 32 pages.
Office Action for U.S. Appl. No. 14/518,564, dated Jul. 20, 2017, Kann, "Grid Topology Mapping With Voltage Data", 18 pages.
Office action for U.S. Appl. No. 14/280,286, dated Aug. 11, 2017, Sonderegger, "Smart Grid Topology Estimator", 15 pages.
Office Action for U.S. Appl. No. 15/431,473, dated May 14, 2018, Aiello, "Electrical Phase Identification", 7 pages.
The Australian Office Action dated May 17, 2018 for Australian Patent Application No. 2017202822, a counterpart foreign application of U.S. Appl. No. 13/560,078, 2 pages.
The Australian Office Action dated Jun. 15, 2018 for Australian Patent Application No. 2016266732, a counterpart foreign application of U.S. Appl. No. 15/058,112, 3 pages.
Australian Examination Report dated Apr. 28, 2016, for Australian Patent Application No. 2012377368, a counterpart application of U.S. Appl. No. 13/560,078,3 pages.
The Australian Office Action dated Jan. 10, 2018 for Australian patent application No. 2015349942, a counterpart foreign application of U.S. Pat. No. 9,781,231, 3 pages.
The Australian Office Action dated Jan. 5, 2018 for Australian Patent Application No. 2017202822, a counterpart foreign application of U.S. Appl. No. 13/560,078, 3 pages.
The Australian Office Action dated Nov. 24, 2017 for Australian Patent Application No. 2015358521, a counterpart foreign application of U.S. Appl. No. 14/558,571, 3 pages.
The Australian Office Action dated Dec. 15, 2017 for Australian Patent Application No. 2015336081, a counterpart foreign application of U.S. Pat. No. 9,568,522, 3 pages.
The Australian Office Action dated Feb. 26, 2018 for Australian Patent Application No. 2015223145, a counterpart foreign application of U.S. Appl. No. 14/280,286, 3 pages.
The Australian Office Action dated Feb. 6, 2018 for Australian patent application No. 2015337110, a counterpart foreign application of U.S. Appl. No. 14/518,564, 3 pages.
The Canadian Office Action dated Feb. 26, 2018 for Canadian patent application No. 2965101, a counterpart foreign application of U.S. Appl. No. 14/518,564, 3 pages.
The Canadian Office Action dated Apr. 9, 2018 for Canadian patent application No. 2969685, a counterpart foreign application of U.S. Pat. No. 9,835,662, 4 pages.
Communication pursuant to Article 94(3) EPC dated Jul. 29, 2016, for EP Application No. 12165026.1, a counterpart application of U.S. Appl. No. 13/560,078, 6 pages.
The Japanese Office Action dated Apr. 24, 2018 for Japanese Patent Application No. 2016-553860, a counterpart foreign application of U.S. Appl. No. 14/280,286.
The Japanese Office Action dated Apr. 3, 2018 for Japanese Patent Application No. 2016-553886, a counterpart foreign application of U.S. Appl. No. 14/302,617.
Office Action for U.S. Appl. No. 14/302,617, dated Jan. 5, 2018, Sonderegger, "Detection of Electric Power Diversion", 29 pages.
Office Action for U.S. Appl. No. 15/431,473, dated Dec. 29, 2017, Kann, "Electrical Phase Identification", 7 pages.
Office Action for U.S. Appl. No. 14/518,564, dated Dec. 7, 2017, Kann, "Grid Topology Mapping With Voltage Data", 19 pages.
Office Action for U.S. Appl. No. 15/058,112, dated Mar. 29, 2018, Aiello, "Automatic Network Device Electrical Phase Identification", 14 pages.

(56) References Cited

OTHER PUBLICATIONS

The European Office Action dated Dec. 4, 2018 for European Patent Application No. 15710638.6, a counterpart of U.S. Appl. No. 14/280,286, 6 pages.
The Australian Office Action dated Oct. 25, 2018 for Australian Patent Application No. 2017202822, a counterpart foreign application of U.S. Pat. No. 9,924,242, 5 pages.
The Canadian Office Action dated Oct. 2, 2018, for Canadian patent Application No. 2987580, a counterpart foreign patent application of the U.S. Appl. No. 15/058,112, 9 pages.
The European Office Action dated Sep. 17, 2018, for European Patent Application No. 15710639.4, a counterpart foreign application of U.S. Appl. No. 14/302,617, 10 pages.
Office Action for U.S. Appl. No. 15/925,651, dated Oct. 2, 2018, Van Wyk, "Automatic Network Topology Detection and Fraud Detection," 24 pages.
Office Action for U.S. Appl. No. 14/302,617, dated Sep. 18, 2018, Robert Sonderegger, "Detection of Electric Power Diversion," 39 pages.
The European Office Action dated Aug. 16, 2019 for European Patent Application No. 16722992.1, a counterpart of U.S. Pat. No. 10,312,681, 6 pages.
The Japanese Reconsideration Report dated Jul. 30, 2019 for Japanese Patent Application No. 2016-007750, a counterpart of U.S. Appl. No. 14/302,617, 4 pages.
The Australian Office Action dated Feb. 12, 2019 for Australian Patent Application No. 2018201911, a counter part of U.S. Appl. No. 14/280,286, 3 pages.
The European Office Action dated Jan. 3, 2019 for Eurpoean Patent Application No. 15802317.6, a counterpart foreign application of the U.S. Pat. No. 9,781,231, 5 pages.
The European Office Action dated Feb. 21, 2019 for European Patent Application No. 16722992.1, a counterpart of U.S. Appl. No. 15/058,112, 5 pages.
The Japanese Office Action dated Feb. 12, 2019 for Japanese Patent Application No. 2016-553886, a counterpart of U.S. Appl. No. 14/302,617, 1 page.
Office Action for U.S. Appl. No. 14/302,617, dated Jan. 11, 2019, Robert Sonderegger, "Detection of Electric Power Diversion", 35 pages.
Office action for U.S. Appl. No. 13/560,078, dated Oct. 2, 2015, Van Wyk, "Automatic Network Topology Detection and Fraud Detection", 29 pages.
PCT Search Report and Written Opinion dated Oct. 20, 2015 for PCT Application No. PCT/US15/44191, 11 pages.

\* cited by examiner

SMART GRID TOPOLOGY ESTIMATOR

RELATED APPLICATIONS

This patent application claims priority to U.S. patent application Ser. No. 61/944,551, titled "Smart Grid Topology Estimator", filed on Feb. 25, 2014, commonly assigned herewith, and hereby incorporated by reference.

BACKGROUND

Smart meters and other devices in the smart grid provide increasingly sophisticated analysis of data to better manage electrical distribution. Aggregating data from smart meters allows utility companies to anticipate bottlenecks, avoid power failures, and generally optimize grid operation. Transformers step down medium transmission voltage to household voltage levels for supply to connected meters. Performing the sophisticated analysis and leveraging the information from the smart meters and other network nodes requires an accurate knowledge of which meters are connected to each transformer.

Current utility and distribution companies may or may not maintain connectivity information for individual meters. Where such information is collected, it is frequently poorly maintained and error-prone. Line workers may change connections under time pressure to alleviate local power problems without updating appropriate records. Because transformers usually stay in service for decades, errors within the connectivity information can accumulate and degrade smart grid functionality.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components. Moreover, the figures are intended to illustrate general concepts, and not to indicate required and/or necessary elements.

DETAILED DESCRIPTION

Overview

The disclosure describes techniques for determining aspects of the topology of an electrical network, and more specifically for determining if two electrical meters are connected to a same transformer. Determining which meters are connected to each transformer is particularly important in a smart electrical grid environment, and improves data utilization and electrical grid operation.

In a first example of the techniques, voltage changes measured or "seen" at one meter may result from activity by the consumer associated with that meter, or from the activity of other consumers associated with other meters that are attached to the same transformer. That is, changes in loads (e.g., an appliance turning on or off) at any customer on a same transformer may result in voltage fluctuations seen to varying degrees at all meters attached to the transformer. The strongest voltage change or fluctuation will be seen at the meter directly linked to the change in load; however, other meters connected to the same transformer will likely see voltage fluctuations of the same sign but lesser magnitude. By correlating a time-series of voltage-changes associated with two meters, it can be determined if it is likely that the two meters are connected to the same transformer.

In a second example of the techniques, time-stamped voltage data may be collected from multiple meters, including at least a first meter and a second meter, over a same period of time. A time-series of voltage-changes may be generated for each of the first meter and the second meter using each meter's collected time-stamped voltage data. As indicated above, the voltage levels seen at every meter connected to the same transformer will fluctuate based in part on load changes at any customer on the same transformer. As a result, the time-series of voltage-changes of any two meters attached to the same transformer will correlate according to the common fluctuations. Accordingly, a correlation may be calculated between the time-series of voltage-changes of the first meter and the time-series of voltage-changes of the second meter, and may be used to determine an "affinity" between any two meters. In one example, the affinity between two meters represents the degree to which a time-series of voltage-changes seen by two meters is statistically correlated. Such calculations may be used when two meters are physically close enough to potentially be connected to the same transformer. Using the calculated correlation, it may be determined if the first and second meters are (or likely are) connected to the same transformer. Based at least in part on the determined connection, topological data may be configured to show a relationship between the first meter and the second meter.

Example System and Techniques

Figure 1:
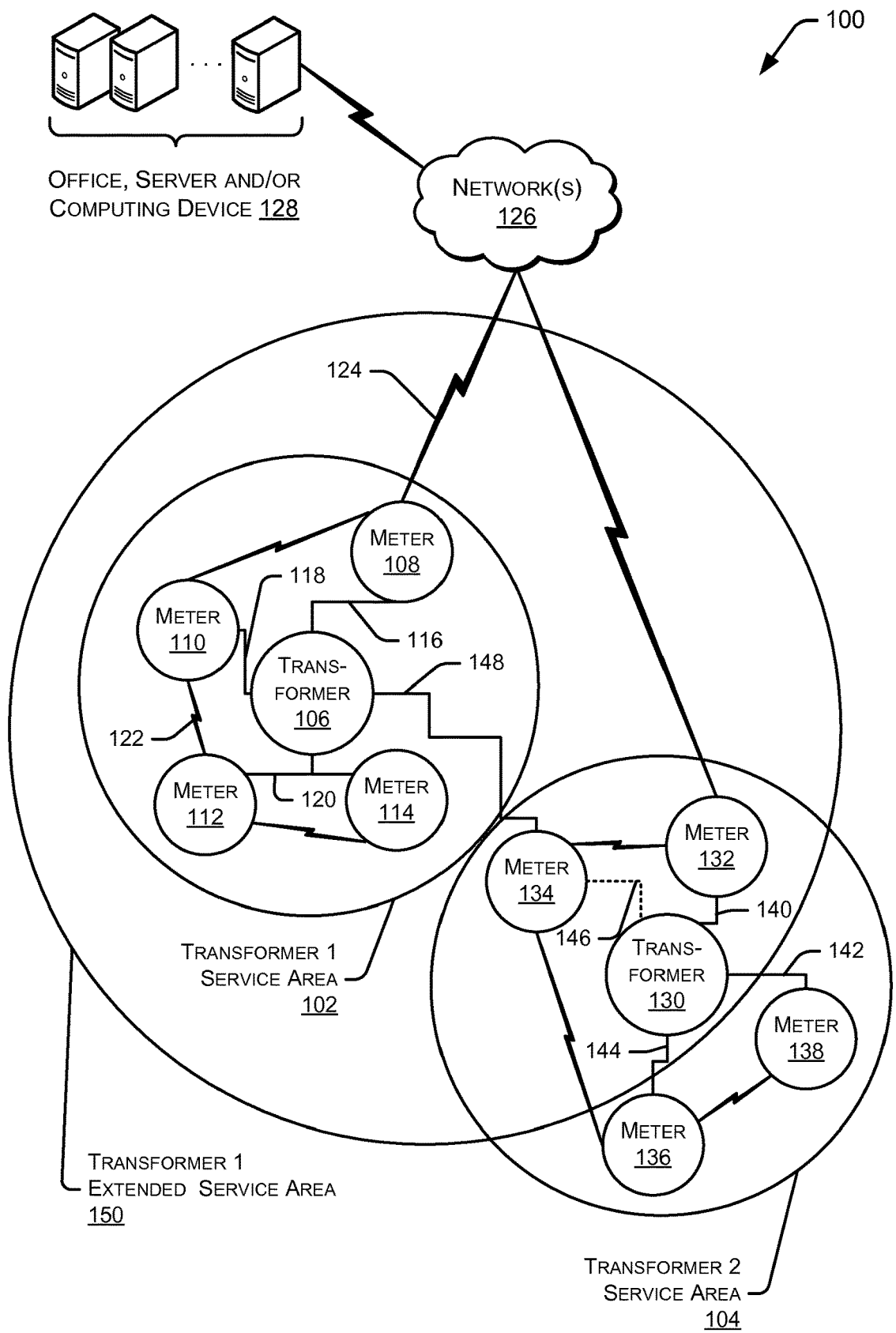
FIG. 1 is a block diagram showing an example smart grid environment wherein two transformer service areas each include a plurality of meters, and wherein one or more meters may mistakenly be believed by the owning utility to be located in a particular transformer service area.

FIG. 1 is a block diagram showing an example smart grid environment 100 in which two transformer service areas 102, 104 each include a plurality of meters. In the example shown, a transformer 106 within the transformer service area 102 provides electrical power to meters 108-114. The meters 108, 110 are connected to transformer 106 by wired connections 116, 118. The meters 112, 114 are connected to the transformer 106 by a shared connection 120.

The meters 108-114 communicate data, updates and other information by RF or wired links (e.g., RF link 122), which may form a mesh or star network, etc. The meters 108-114 may transmit data up- and downstream by one or more RF links 124 and/or a backhaul network 126, such as the Internet or a private network. Accordingly, an office, server or computing device 128 may communicate with the meters 108-114 and the meters may communicate among themselves.

Similarly, transformer 130 within transformer service area 104 provides power to meters 132-138 over wiring 140-146. RF links allow the meters 132-138 to communicate between each other and the office, server or computing device 128.

As indicated above, transformer 106 is wired to a plurality of meters within a transformer service area 102. However, a larger region, shown as extended service area 150, defines an area that is sufficiently close to the transformer 106 that any meter within that area could be operationally connected to the transformer 106. Thus, while the distance between a transformer and an attached meter is limited, any meter within the extended service area 150 could potentially be serviced by transformer 106.

Utility companies typically document how utility meters, transformers and other utility distribution network components are attached to one another. However, it is possible for a meter to be erroneously listed in utility company records as being attached to transformer 130. As a particular example of such an error, meter 134 is within transformer service area 104, and is associated with transformer 130 in utility company records. In particular, meter 134 is connected (at least in theory) by wiring 146 to transformer 130. However, meter 134 may actually be connected to transformer 106 by wiring 148. Such a connection is possible because meter 134 is within the extended service area 150 of transformer 106. This error may be a result of data entry errors, failure of technicians to update records, relocation of a meter by a consumer (e.g., to steal electricity), etc. The erroneous records of the utility company may prevent the smart grid environment 100 from functioning as efficiently as it might otherwise.

However, by applying the techniques described herein—in part because the meters 108-114 and 132-138, and office and/or computing facility 128, have a structure and functionality described herein below—the true connection between meter 134 and its transformer is discoverable, and the topology of the smart grid may be more fully understood.

Figure 2:
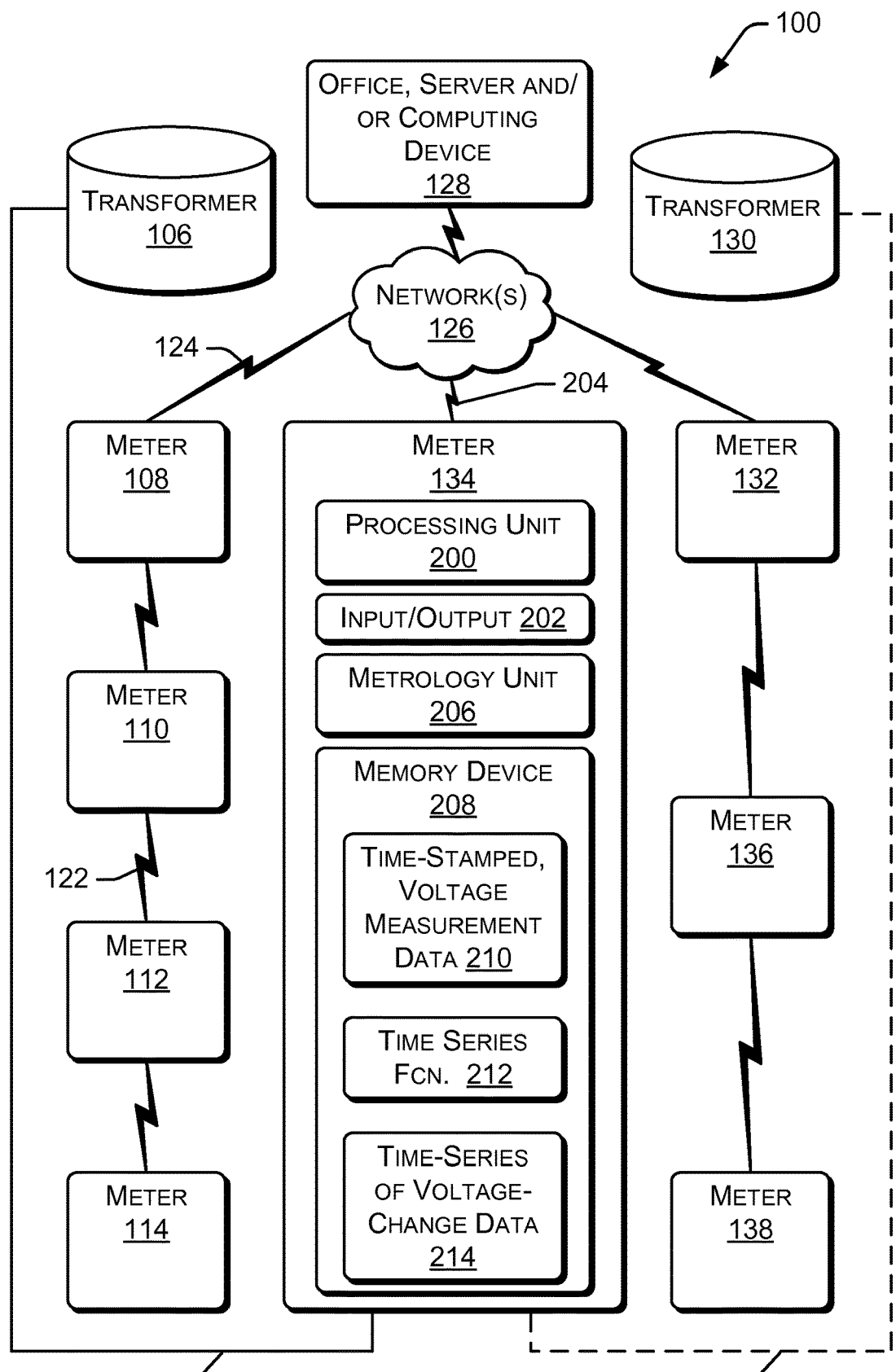
FIG. 2 is a block diagram showing example structure and functionality of a meter that is connected to a first transformer, but which erroneous record-keeping indicates is connected to a second transformer.

FIG. 2 is a block diagram showing example structure and functionality of the meter 134 within the example smart grid environment 100. The meter 134 is representative, though not determinative, of the structure of other meters 108-114, 132, 136, and 138, etc. As discussed with respect to FIG. 1, meter 134 is actually connected to a transformer 106 by wiring 148. However, erroneous recordkeeping indicates that meter 134 is connected to transformer 130 by (non-existent) wiring 146. Using techniques described herein, the correct network topology may be derived.

A processing unit 200 may include a processor (e.g., general purpose microprocessor, CPU, GPU, etc.), application specific integrated circuit (ASIC) or other computing device configured to execute programs and/or perform logical or algorithmic actions. The processing unit 200 may communicate with an I/O unit 202, which may in turn communicate with other network devices over an RF link 204, power line communications (PLC) or other means.

A metrology unit 206 is configured to measure voltage, current and/or power consumption by a consumer/customer associated with the meter 134. Measurement data (e.g., voltage, current and/or power measurements) from the metrology unit 206, which may be associated (time stamped) with times at which each measurement was made, may be stored in an appropriate data structure within a memory device 208.

The processing unit 200 may also communicate with the memory device 208 and/or other memory devices, which may contain programs, applications, data structures or other information. In the example shown, voltage measurements made by the metrology unit 206 may be time stamped and stored as time-stamped voltage measurement data 210.

A time-series function 212 may be defined by program statements and stored in the memory device 208 or other locations. The time-series function 212 may be configured to input the time-stamped voltage measurements 210 and to output a time-series of voltage-changes for storage in memory device 208. As will be discussed in greater detail in FIGS. 5 and 6, the changes in voltage seen at the meter 134 and/or metrology unit 206, and the times of those changes, may be utilized to create the time-series of voltage-changes. In one example, the time-series of voltage-changes may be stored in a time-series of voltage-changes data structure 214 or file system within memory device 208.

Figure 3:
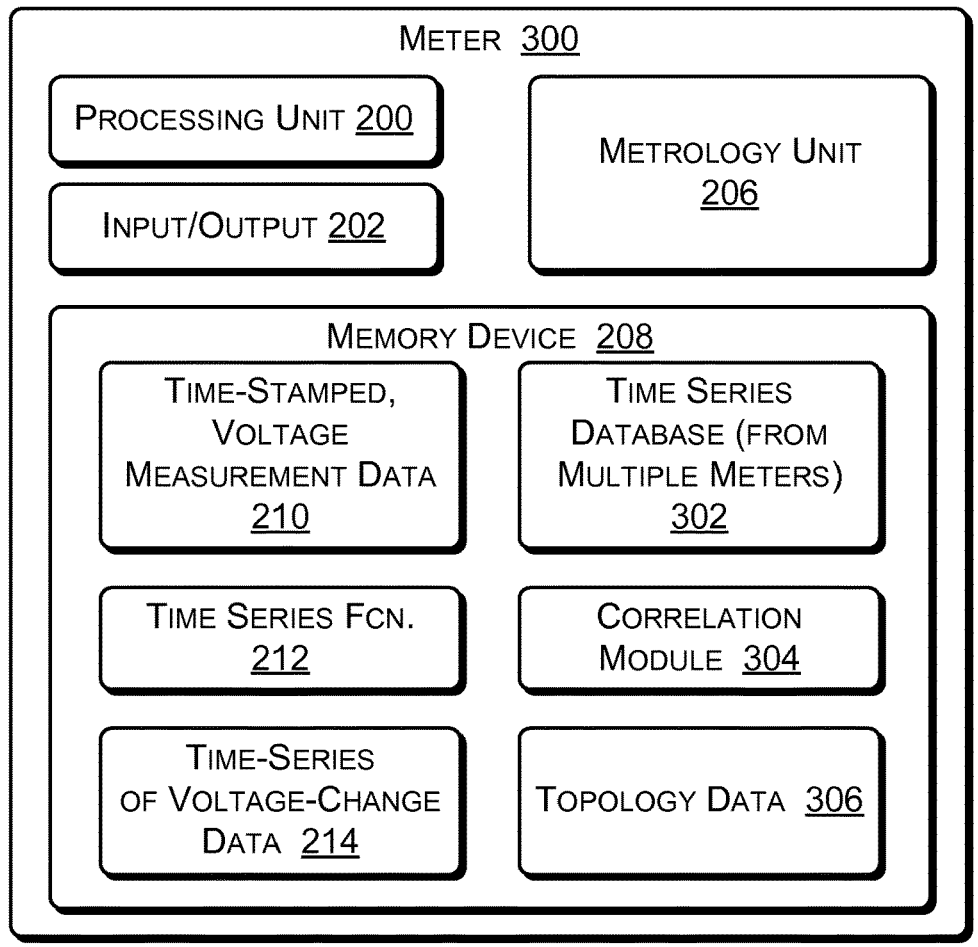
FIG. 3 is a block diagram showing example structure and functionality of a meter configured to perform correlation functionality, and to thereby determine an affinity between the meter and other meters that may indicate connectivity to a same or a different transformer.

FIG. 3 is a block diagram showing example structure and functionality of a meter 300 configured to perform correlation functionality, and to thereby calculate an affinity between the meter and other meters close enough (e.g., within an extended transformer service area 150) to be serviced by a single transformer. The calculated affinity or correlation may indicate aspects of network topology, including connectivity of the meter 300 to a same or a different transformer as another meter. The meter 300 may include a processing unit 200, I/O functionality 202 and a metrology unit 206, which may be as described with respect to meter 134 and FIG. 2.

The memory device 208 may include one or more applications, programs, data or other information. As one example of data stored in the memory device 208, time-stamped voltage measurement data 210 may contain collected measurements obtained from the metrology unit 206. The time-stamped voltage data 210 may be collected from the metrology unit 206, and may be processed by the time-series function or application 212 to generate the time-series of voltage-change data 214.

Time-series of voltage-change data from nearby meters (e.g., meters within a distance that is slightly greater than or equal to the extended service area of a transformer) may be received by the meter 300. The time-series of voltage-change data for each meter may be stored in a time-series database 302, which may be defined on the memory device 208. The time-series of voltage change data received by the meter 300 may be accompanied by coordinates of the transmitting meter. The coordinates may be in X-Y form, e.g., latitude and longitude or similar. The meter 300 may use the coordinates (e.g., by application of Pythagoras' Theorem) to determine the distance between any two meters.

A correlation module 304 may calculate a correlation between pairs of time-series of voltage-changes associated with respective pairs of meters. The time-series of voltage-changes may be obtained from the time-series database 302. The correlation module 304 may include statistical tools and/or algorithms configured to calculate the correlation of each pair of time-series of voltage-changes. Correlation may be measured at least in part by comparing instances of corresponding voltage change at similar times. Correlation algorithms may also consider instances of dissimilar or non-corresponding times of voltage change when considering two time-series of voltage-changes. In a first example of techniques usable by the correlation module 304, if the correlation between two time-series of voltage-changes is low (e.g., below 30%), it is unlikely that the respective two meters are connected to a same transformer. Conversely, if the correlation between two time-series of voltage-changes is high (e.g., between 70% and 99%), it is likely that the respective two meters are connected to the same transformer. And further, if the correlation between two time-series of voltage-changes is particularly high (e.g., above 95%), it the respective two meters may be connected to the same transformer by at least some shared wiring. For example, the wiring from the transformer may "Y" to connect to each of the two meters.

In another example of operation of a correlation module 304, a calculated correlation between two meters may be compared to ranges of correlation different from those discussed above, and conclusions drawn from the comparison. And in a further example, techniques illustrated by FIG. 11 and associated discussion introduce the concept of home vs. away affinity to assist in determining network or grid topology.

The correlation module 304 may determine which meters are connected to the same transformer(s) within a portion of an electrical grid. The determined information may be used to generate and/or update topological information describing the electrical grid. The topology data 306 may be configured as a map, table, database or other data structure, and may contain information describing components and connectivity on the electrical distribution grid. In particular, the topology data 306 may describe which meters are connected to which transformers.

Figure 4:
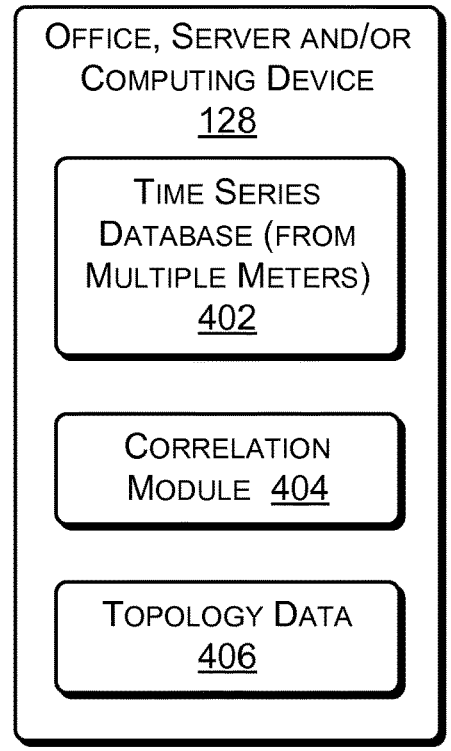
FIG. 4 is a block diagram showing example structure and functionality of a computing device remote from a meter that is configured to perform correlation functionality.

FIG. 4 is a block diagram showing example structure and functionality of a computing device other than a meter that is configured to perform correlation and topology maintenance and update functionality. In the example shown, a main or central office, server, server farm or other computing device(s) 128. The computing device 128 is configured to receive and store time-series of voltage-change data from multiple meters in a time-series database 402. A correlation module 404 calculates a correlation between pairs of time-series of voltage-changes. The topology data 406 may be created, updated or maintained using input from the correlation module 404.

Figure 5:
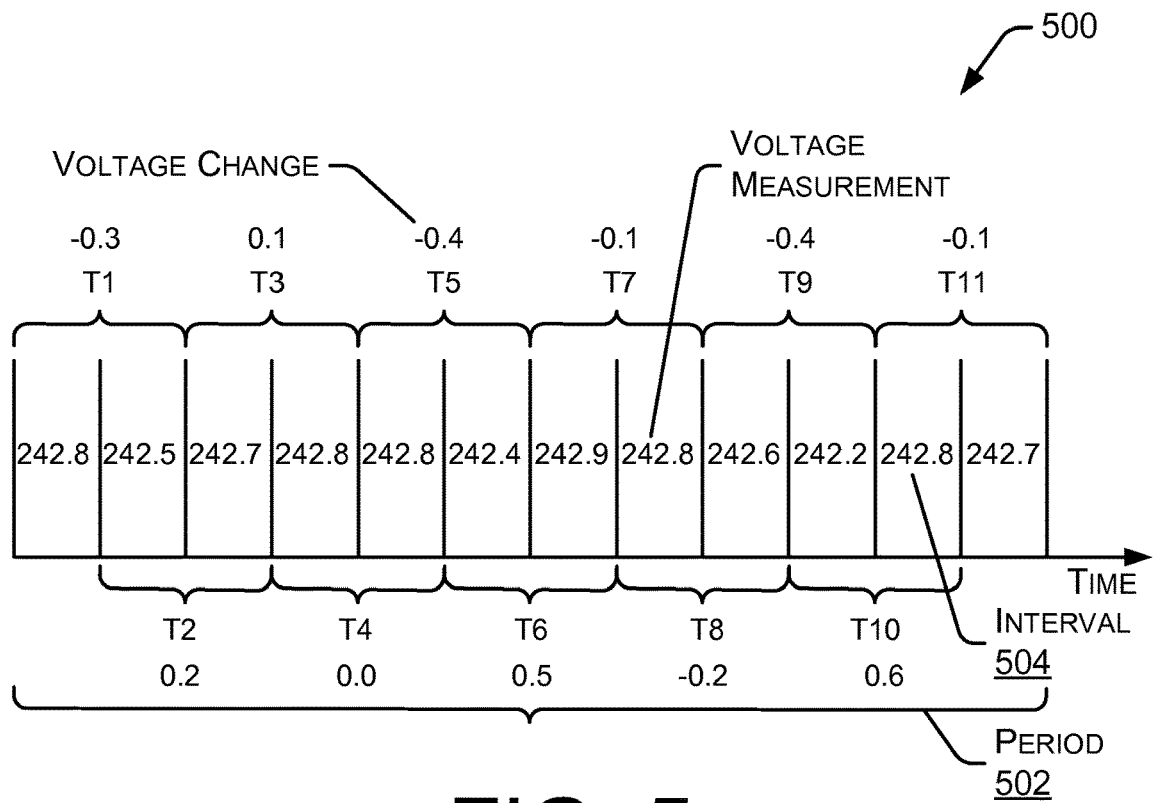
FIG. 5 is a timing diagram showing a first example of the voltage measurements and time-stamping usable to generate a time-series of voltage-change data wherein the underlying intervals within a period of measurement are uniform.

FIG. 5 is a timing diagram showing a first example of voltage measurements and time-stamping 500 usable to generate a time-series of voltage-change data, wherein the underlying intervals within a period of measurement are uniform. In the example of FIG. 5, a defined period of time 502 is used by a plurality of meters to perform the smart grid topology estimation. That is, each meter makes voltage measurements over the same period of time 502 so that voltage changes resulting from load changes of a particular consumer attached to a particular transformer may potentially be seen by some of the plurality of meters. The period of time may range from minutes to days, as desired. The period of time 502 may be divided into a plurality of intervals 504. In the example shown, twelve (12) intervals are shown. A voltage measure (e.g., 242.8 volts) is associated with each interval. The intervals 504 may be considerably shorter than the period 502; e.g., the intervals may be seconds or minutes, as desired.

The change in voltage from one interval to the next interval may be used to form a time-series of voltage-changes. Values in an example time-series are labeled T1 through T11. Each element in a time-series includes a voltage-change and an associated time of that change. As one element in a time-series, the voltage-change at the time T1 is −0.3 volts. The voltage change at the time T2 is 0.2 volts, and time T3 is 0.1 volt, etc. A time-series of voltage-changes may be constructed from such a sequence.

Accordingly, the time-series of voltage-changes associated with the voltage measurements and time-stamping 500 for a particular meter is the series (T1, −0.3); (T2, 0.2); (T3, 0.1); (T4, 0.0); (T5, −0.4); (T6, 0.5); (T7, −0.1); (T8, −0.2); (T9, −0.4); (T10, 0.6); (T11, −0.1). Other meters connected to the same transformer may have time-series of voltage-changes having a high correlation to the above time-series of voltage-changes if the voltage measurements were made over the same period of time 502. Other meters not connected to the same transformer would likely have time-series of voltage-changes with less correlation.

Figure 6:
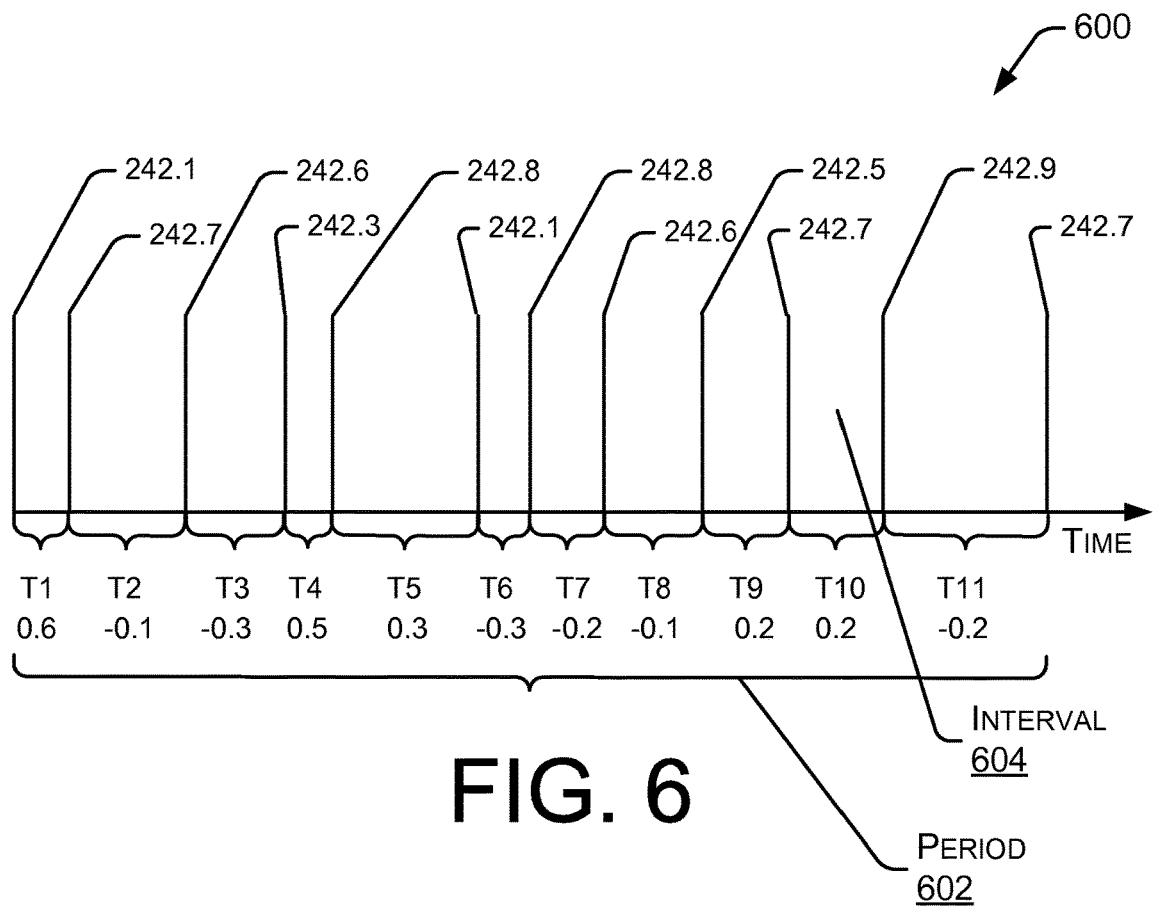
FIG. 6 is a timing diagram showing a second example of the voltage measurements and time-stamping usable to generate a time-series of voltage-change data wherein the underlying intervals within a period of measurement are non-uniform.

FIG. 6 is a timing diagram showing a second example of the voltage measurements and time-stamping 600 usable to generate a time-series of voltage-change data. The period 602 is similar to the period 502 of FIG. 1. However, in this example, the intervals 604 within a period 602 are non-uniform. For example, the voltage seen by a metrology unit may be substantially constant until there is a change in a load (e.g., an appliance turning on or off) at one of the customers attached to a transformer. At the time of the load change, a corresponding change in a voltage measurement may result. This voltage change may be used to conclude one interval and begin another interval.

In the example of FIG. 6, the time-series of voltage-changes is the series (T1, 0.6); (T2, −0.1); (T3, −0.3); (T4, 0.5); (T5, 0.3); (T6, −0.3); (T7, −0.2); (T8, −0.1); (T9, 0.2); (T10, 0.2); (T11, −0.2).

Example Applications of Time-Series of Voltage-Change Correlation

Figure 7:
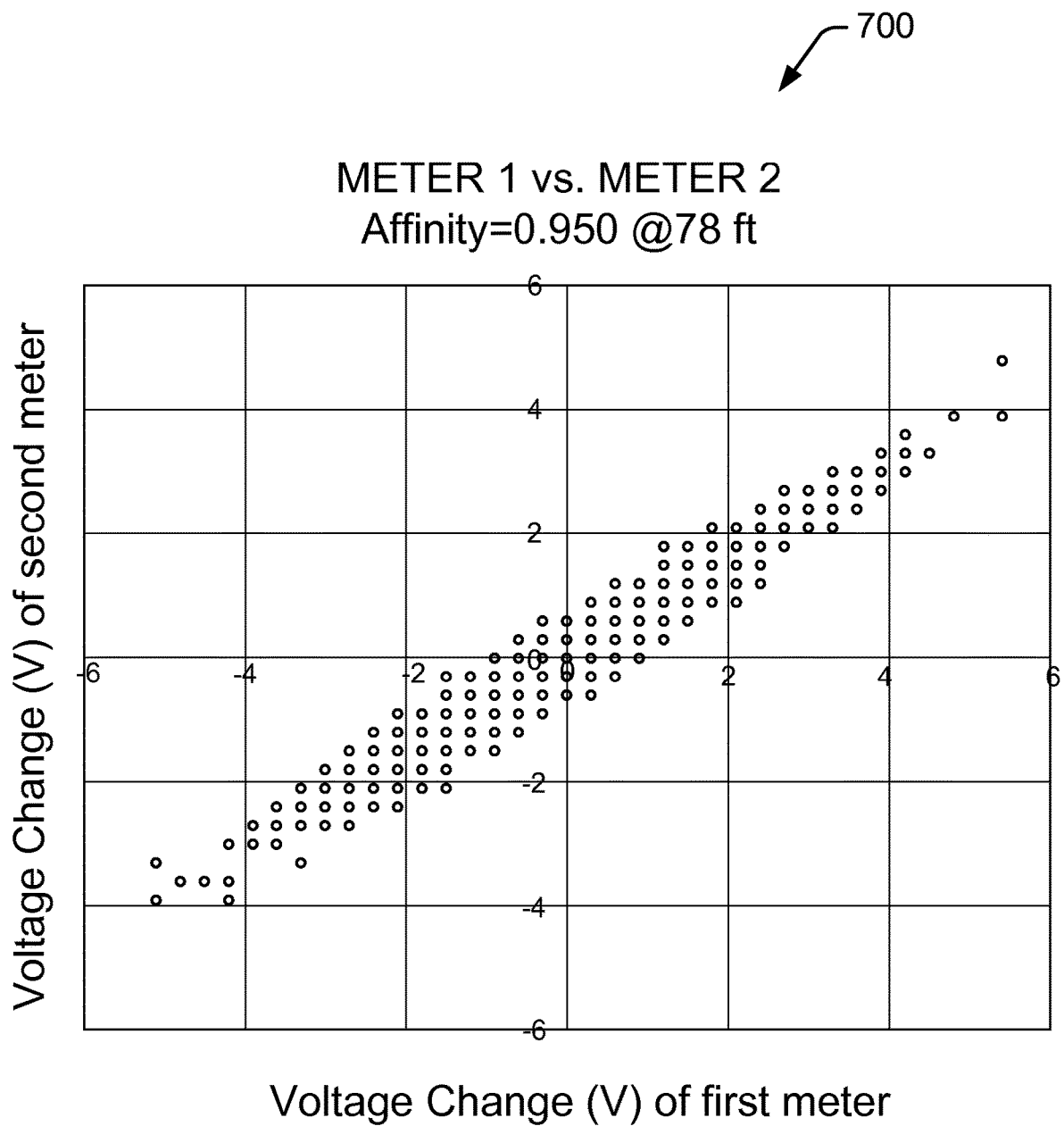
FIG. 7 is graph showing an example of strong correlation between two meters, as indicated by data collected over uniform 5-minute intervals over a period of 15 days.

FIG. 7 is graph 700 showing strong correlation between two example meters, as indicated by data collected over uniform 5-minute intervals over a period of 15 days. Accordingly, the graph 700 shows an example of topology data 306 produced by the correlation module 304 in the example of FIG. 3. In the example shown, the two meters are indicated by their network numbers, have an affinity of 0.950 and are indicated to have a separating distance of 78 feet. This distance is consistent with connection of both meters to a same transformer. The horizontal axis shows voltage change of a first meter, while the vertical axis shows voltage change of a second meter.

The graph 700 shows a correlation of typical voltage changes (between +6 volts and −6 volts) consistent with two meters on the same transformer. As an example of the information contained in the graph 700, the top-most, right-most point in the chart represents a voltage change of +5.4 V of the first meter (i.e., meter 1) at the same time as the second meter in the chart title (i.e., meter 2) experiences a voltage change of +4.8 V. The pixilated (i.e., scatter plot) appearance of the graph 100 is caused by the measurement resolution of the meter of 0.3 volts.

A Pearson correlation coefficient for the voltage changes of the pair of meters of graph 700 is calculated to be 0.950. Each point in the graph 700 may represent one or more instances of the same pair of voltage changes over the course of the analysis. Therefore, an alternative way to describe the same data is to summarize the vertical range of the points, which correspond to a range of voltage changes in the second meter, as a box-plot with highest and lowest extremes, as shown in FIG. 8.

Figure 8:
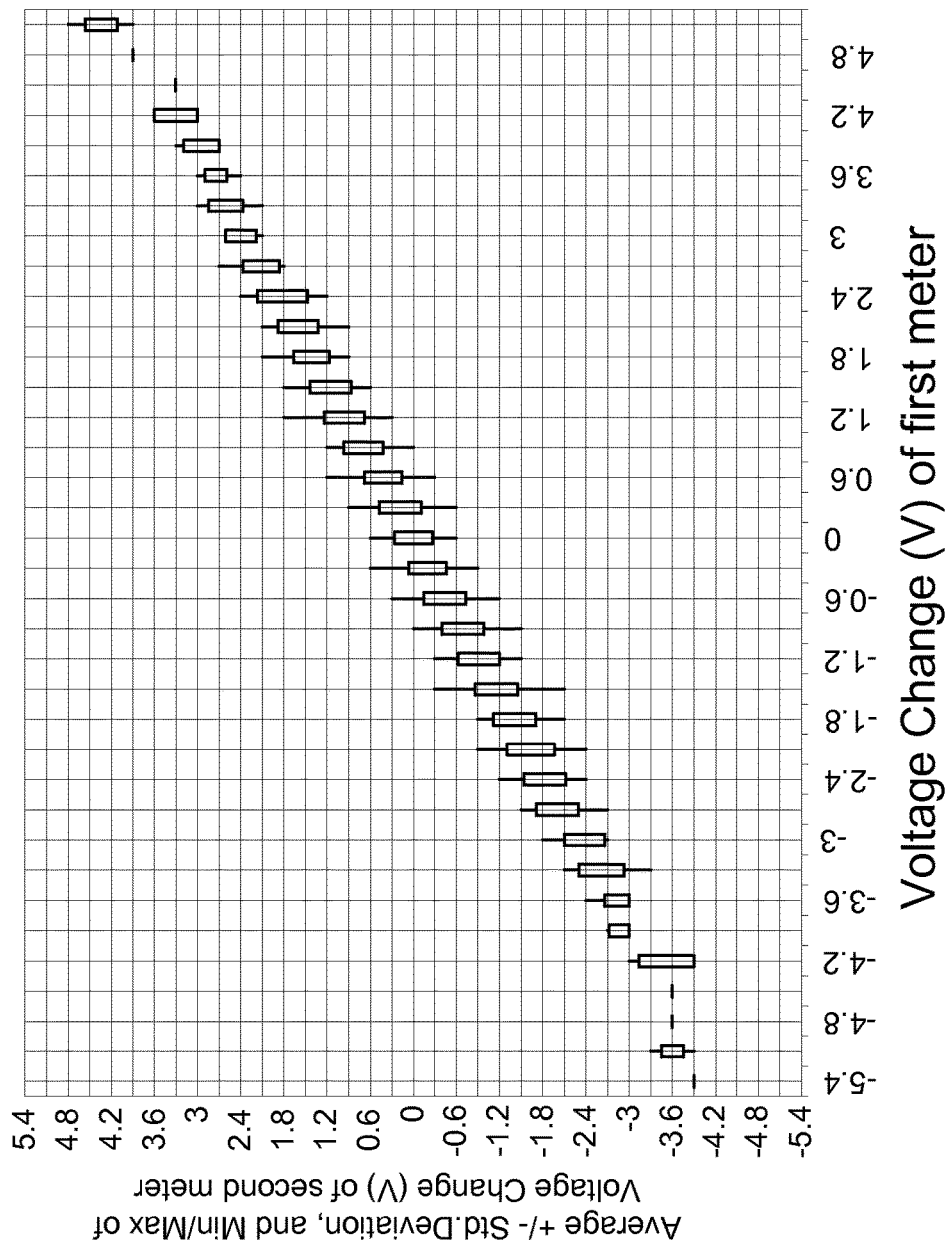
FIG. 8 is graph showing an example relationship of voltage change of a first meter plotted against standard deviation of a second meter, wherein the meters have a strong correlation indicating attachment to a same transformer.

FIG. 8 is graph 800 showing an example relationship of voltage change of a first meter plotted against standard deviation of a second meter, wherein the meters have a strong correlation indicating attachment to a same transformer. On the vertical axis, the boxes indicate one standard deviation above and below the average voltage change of the second meter. The tips of the vertical lines represent the maximum and minimum voltage change of the second meter. The horizontal axis indicates the voltage change in the first meter. The absence of a box indicates that there is only one pair of voltage changes making it impossible to calculate a standard deviation. Consequently, minimum, maximum, and average values coalesce into a single value. In the example of graph 800, the single value is indicated by a short horizontal line symbol, (e.g., in the lowest and left-most point on the chart).

Figure 9:
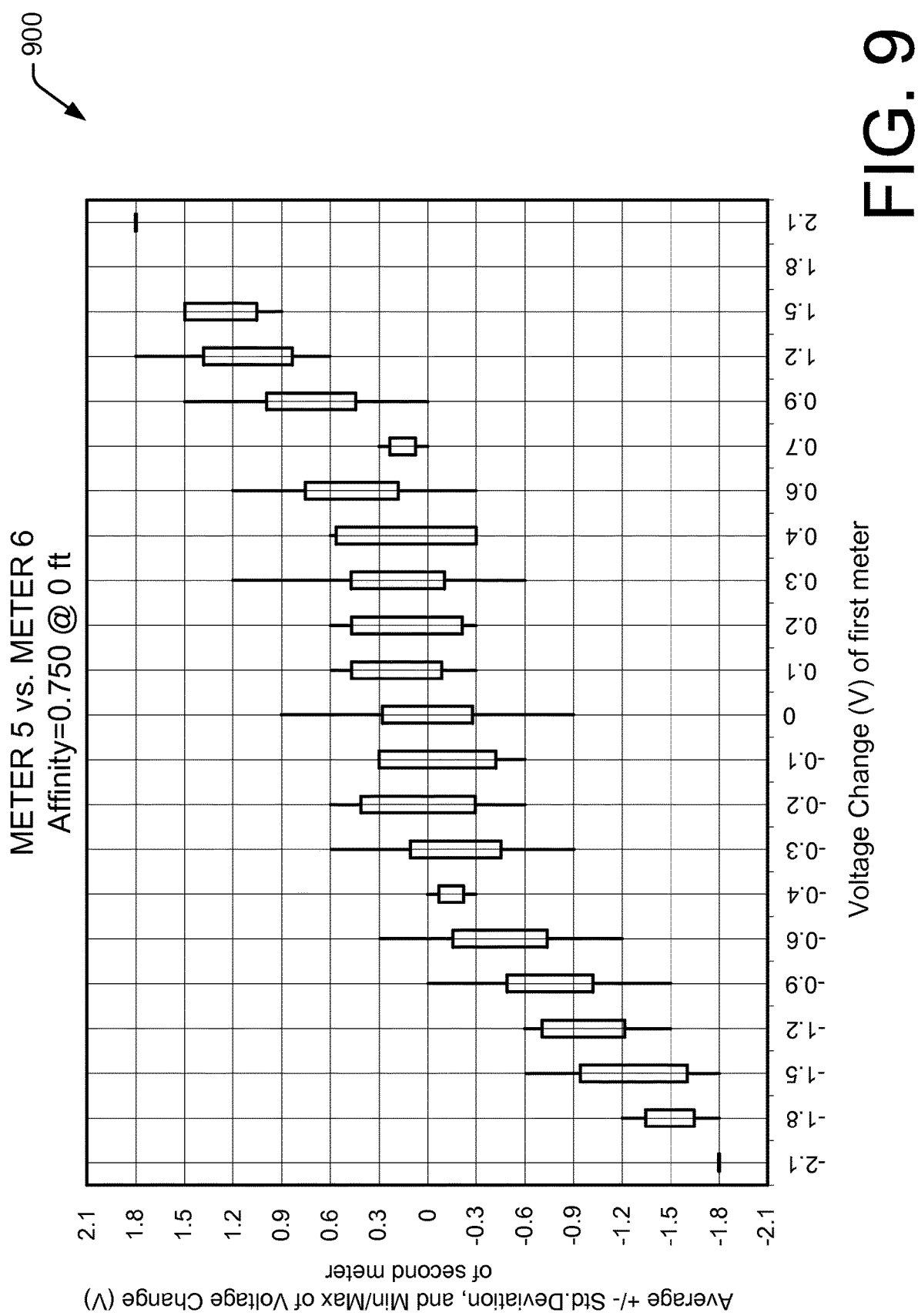
FIG. 9 is graph showing an example relationship of voltage change of a first meter plotted against standard deviation of a second meter, wherein the meters have a weaker correlation than is seen in FIG. 8, but wherein the meters are attached to the same transformer.

Each of the two meters shown in FIGS. 7 and 8 has the same transformer parent. In FIG. 8, the voltage signature affinity is 0.95 (indicating strongly that the two meters are connected to the same transformer). In contrast, FIG. 9 shows a different pair of meters, also on the same transformer, that exhibit slightly lower affinity. Such slightly lower affinity may be caused by longer wiring runs connecting the meters, lower meter voltage measurement resolution, or other factors.

FIG. 9 is graph showing an example relationship of voltage change of a first meter plotted against standard deviation of a second meter, wherein the meters have a weaker correlation than is seen in FIG. 8, but wherein the meters are attached to the same transformer. The relationship appears visually to be less linear and the vertical scatter is greater. This is consistent with a calculated affinity that is lower, at 0.75, than the affinity of the meters described by FIG. 7. The distance between the two meters is zero, which indicates either two apartments in a multi-unit building or an inaccurate data entry by the installer who may have entered the same location for all meters on the same transformer. However, an affinity of 0.75 is still well within the expected range of a pair of meters on the same transformer.

Figure 10:
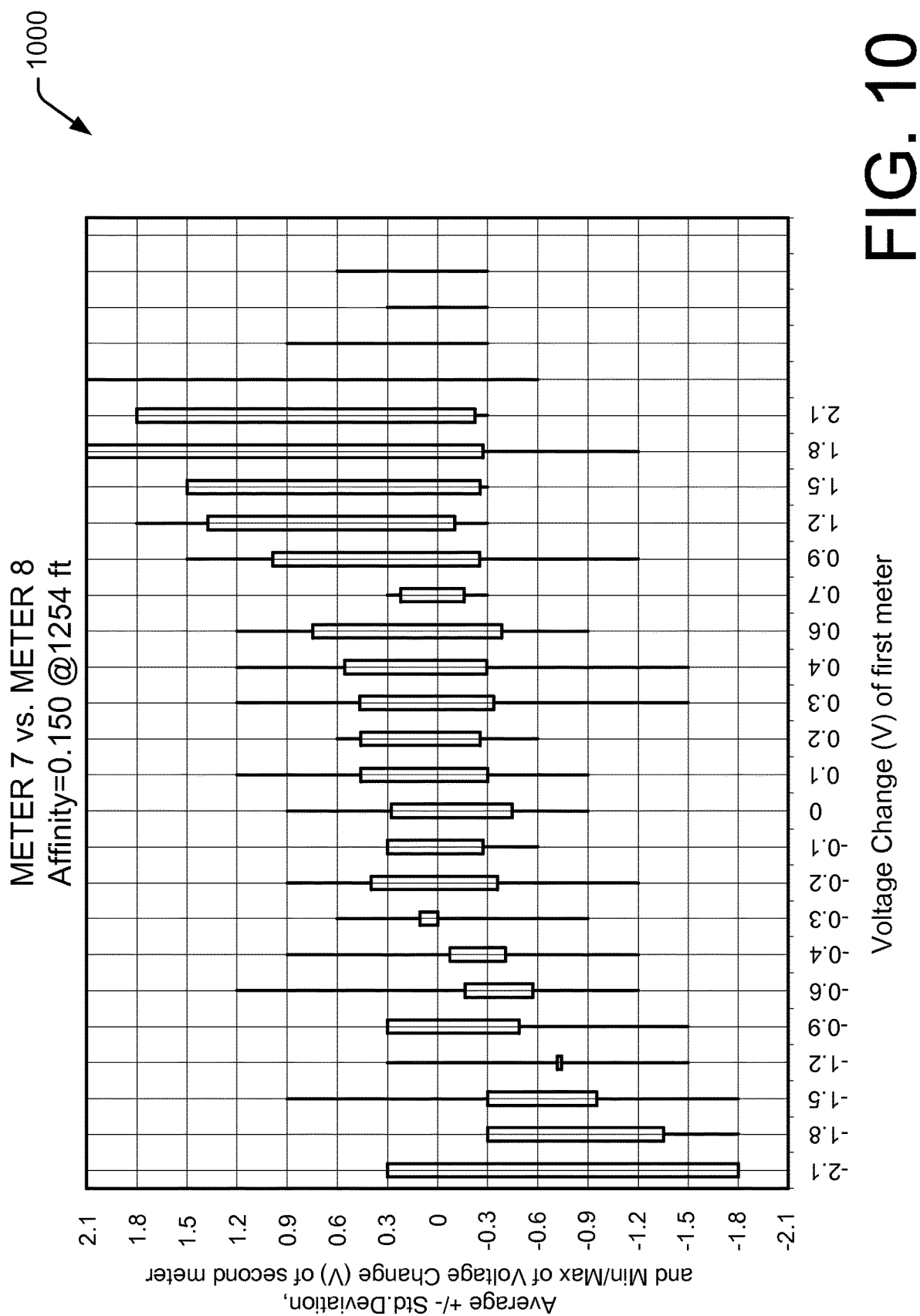
FIG. 10 is graph showing an example relationship of voltage change of a first meter plotted against standard deviation of a second meter, wherein the meters have a weak correlation indicating attachment to different transformers.

FIG. 10 is graph showing an example relationship of voltage change of a first meter plotted against standard deviation of a second meter, wherein the meters have a weak correlation indicating likely attachment to different transformers.

In this example, a pair of meters is connected to different transformers. Different transformers are clearly indicated by the distance between the meters, i.e., 1,254 feet. Correlation is manifestly poor, and the calculated affinity is only 0.15. This is consistent with the observation that the affinity between any two meters connected to the same transformer tends to be significantly higher than for two meters connected to different transformers. Typical affinity values are between 0.5 and 0.99 for meters connected to the same transformer, and typically below 0.6 for meters connected to different transformers. Any ambiguity caused by the overlap can be resolved by comparing home affinity to away affinity as discussed with respect to FIGS. 11 and 13, and associated text. It is also typical for affinity to be higher between meters that share the same connection to their common transformer (e.g., meters 112 and 114 of FIG. 1), as opposed to be connected by individual wires to the common transformer (e.g., meters 108 and 110 of FIG. 1).

Figure 11:
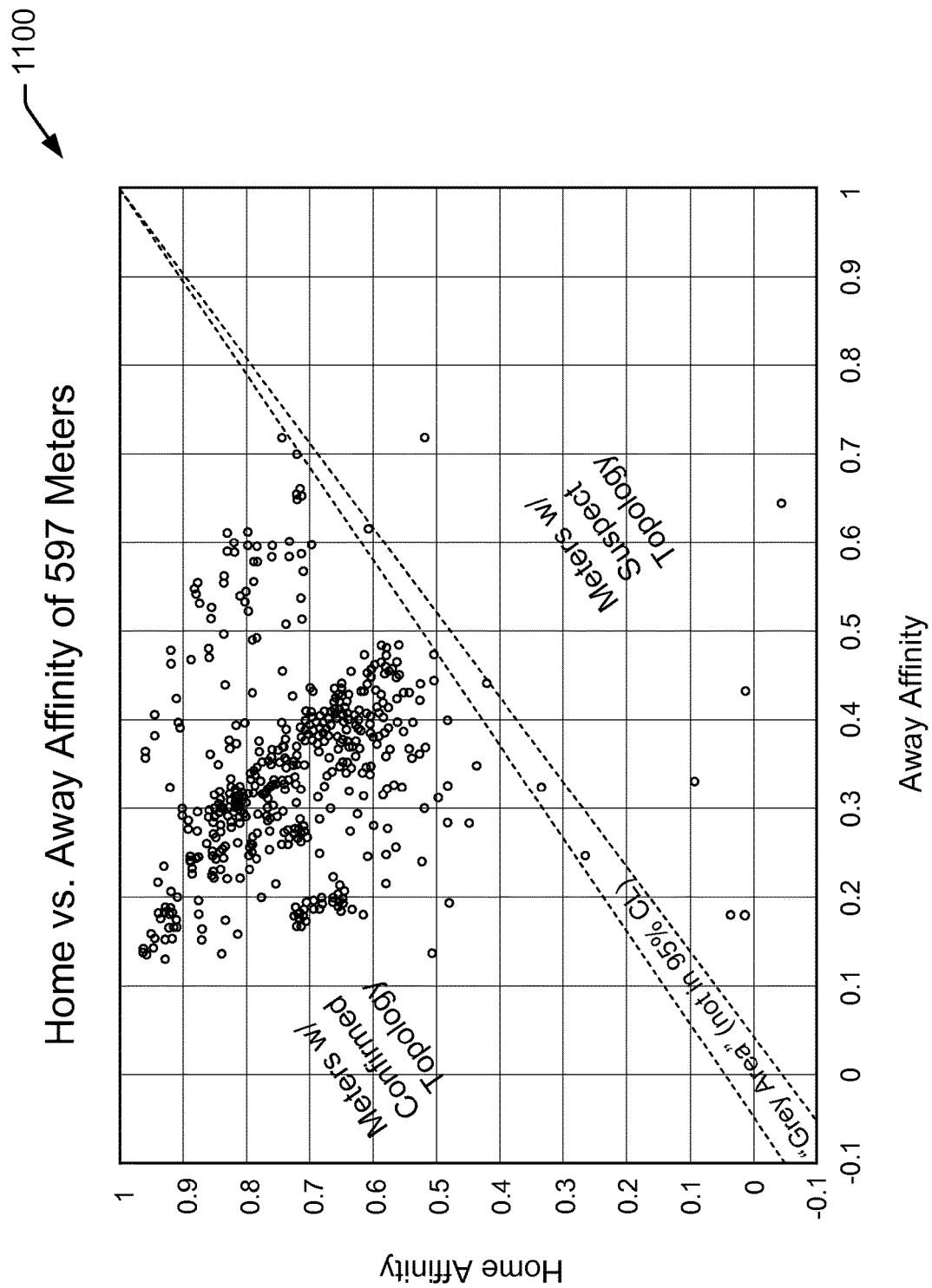
FIG. 11 is graph showing an example use of affinity as a metric to confirm or question an initial assumed topology of a smart grid and/or electrical network.

FIG. 11 is graph 1100 showing an example use of affinity as a tool to confirm or question an initial assumed or recorded topology of a smart grid and/or electrical network. In one example, a threshold value for the affinity or correlation between two meters may be used. If the calculated affinity between the two meters is greater than the threshold, then the meters may be determined to be connected to a same transformer. However, if the calculated affinity or correlation between two meters is less than the threshold, then the meters may be determined to be connected to different transformers and/or to require further investigation. While this example is workable, other techniques are available and described below.

In a further example, for each meter the highest affinity or correlation value against all meters with the same transformer parent (e.g., as indicated by recordkeeping) may be calculated. This affinity or correlation may be termed the "home affinity" and the meters thought to be connected to a same transformer may be termed "home meters." Additionally, the highest affinity or correlation value for each meter may be calculated with respect to all meters indicated by recordkeeping to have different transformer parents and be within a threshold radius (e.g., a radius around the meter that could contain another meter potentially attached to the same transformer as the meter). This affinity or correlation may be termed the "away affinity" and the meters thought to be connected to a same transformer may be termed "away meters." Because meters attached to a same transformer have greater affinity, it would be expected that all of the affinity values of home meters (the "home affinities") will be higher than affinity values of away meters (the "away affinities"). If a meter has a greater affinity or correlation with an away meter than one or all of the home meters, there is likelihood of erroneous recordkeeping of the different meters connected to different transformers. If the affinity/correlation values of an away meter are close to that of a home meter, no definitive statement can be made.

The graph 1100 shows an example of home and away affinity for 597 meters. For each meter, a highest correlation with all meters shown by recordkeeping to be connected to a same transformer is calculated. This is the "home affinity." Additionally, a highest correlation with all meters shown by recordkeeping to be connected to different transformers—but which are close enough to possibly be connected to the same transformer—is calculated. This is the "away affinity." Thus, each meter may be graphed based on a magnitude of the home affinity versus the away affinity.

Referring to graph 1100, the vast majority of the meters show higher home affinity than away affinity, as expected. However, six meters (approximately 1% of the total number of meters) are graphed in the lower right half of the chart 1100. These meters display the opposite result, i.e., the away affinity is greater than the home affinity. These six meters should be investigated (or at least flagged in the database), and their true transformer connectivity should be determined.

Another four meters (approximately 0.7% of the total number of meters) are in a "grey area" delimited by 95% confidence limit (95% CL) curves for the number of voltage change values (N=4320) for each meter pair.

For meters with suspect or uncertain topology (i.e., when the recordkeeping is thought to be in error) it is desirable to determine a transformer to which the meter is actually connected. In each of these meters, the affinity with a particular away meter is higher than the affinity with each home meter. Accordingly, the transformer associated with the particular away meter is probably the transformer of the meter. Depending on available personnel, it may be possible to actually confirm the connectivity of meters with suspect or uncertain topology.

Example Methods

In some examples of the techniques discusses herein, the methods of operation may be performed by software defined on memory and/or may be performed by application specific integrated circuits (ASIC). The memory device 208 may comprise computer-readable media and may take the form of volatile memory, such as random access memory (RAM) and/or non-volatile memory, such as read only memory (ROM) or flash RAM. Computer-readable media includes volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. As defined herein, computer-readable media does not include communication media, such as modulated data signals and carrier waves.

Figure 12:
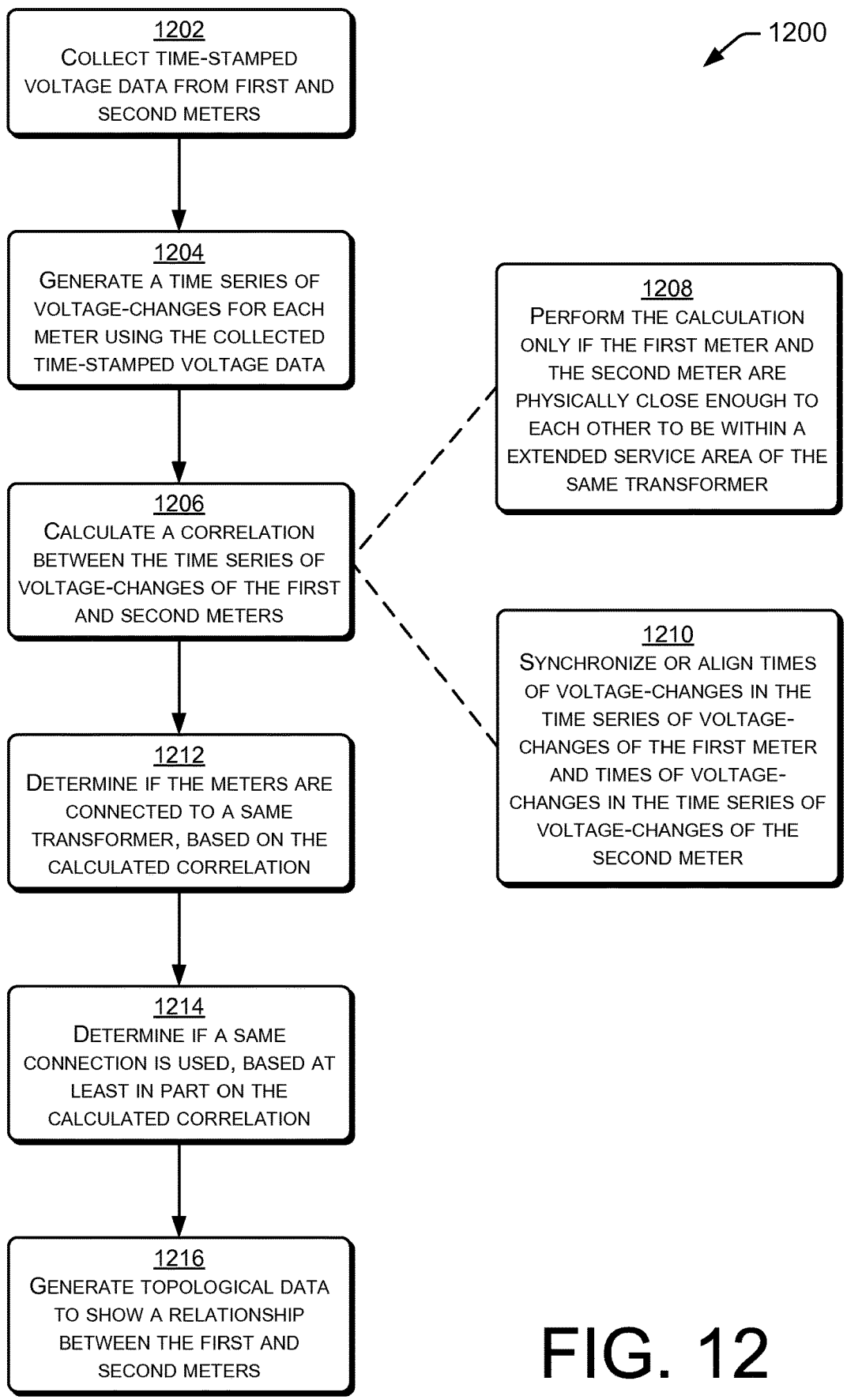
FIG. 12 is a flowchart showing an example method by which the connectivity or "topology" of a smart grid may be estimated, and particularly how a connection between transformer(s) and meter(s) may be estimated, determined and/or confirmed.
Figure 13:
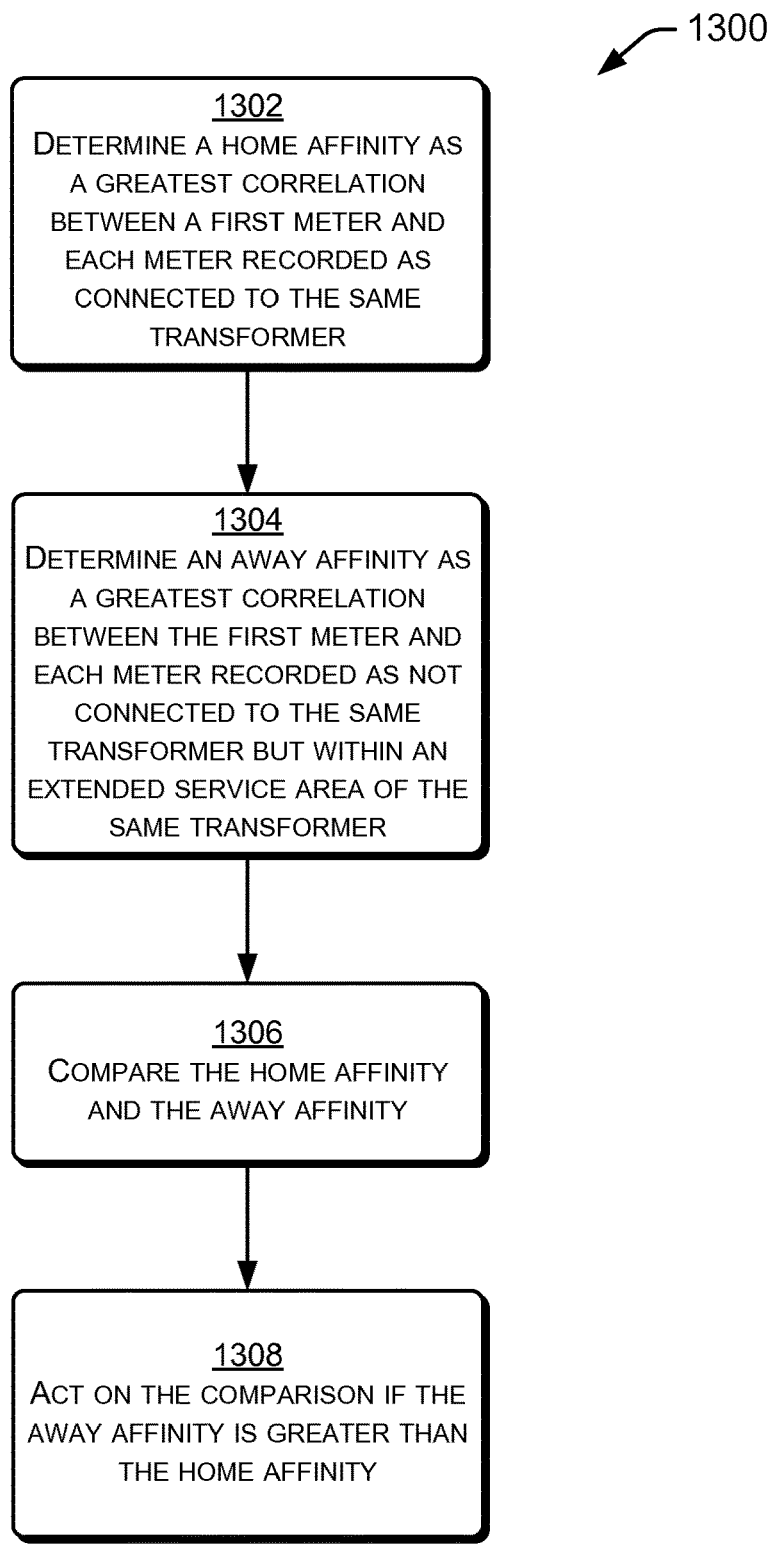
FIG. 13 is a flowchart showing a second example method by which the connectivity or "topology" of a smart grid may be estimated, and particularly how a connection between transformer(s) and meter(s) may be estimated, determined and/or confirmed.
Figure 14:
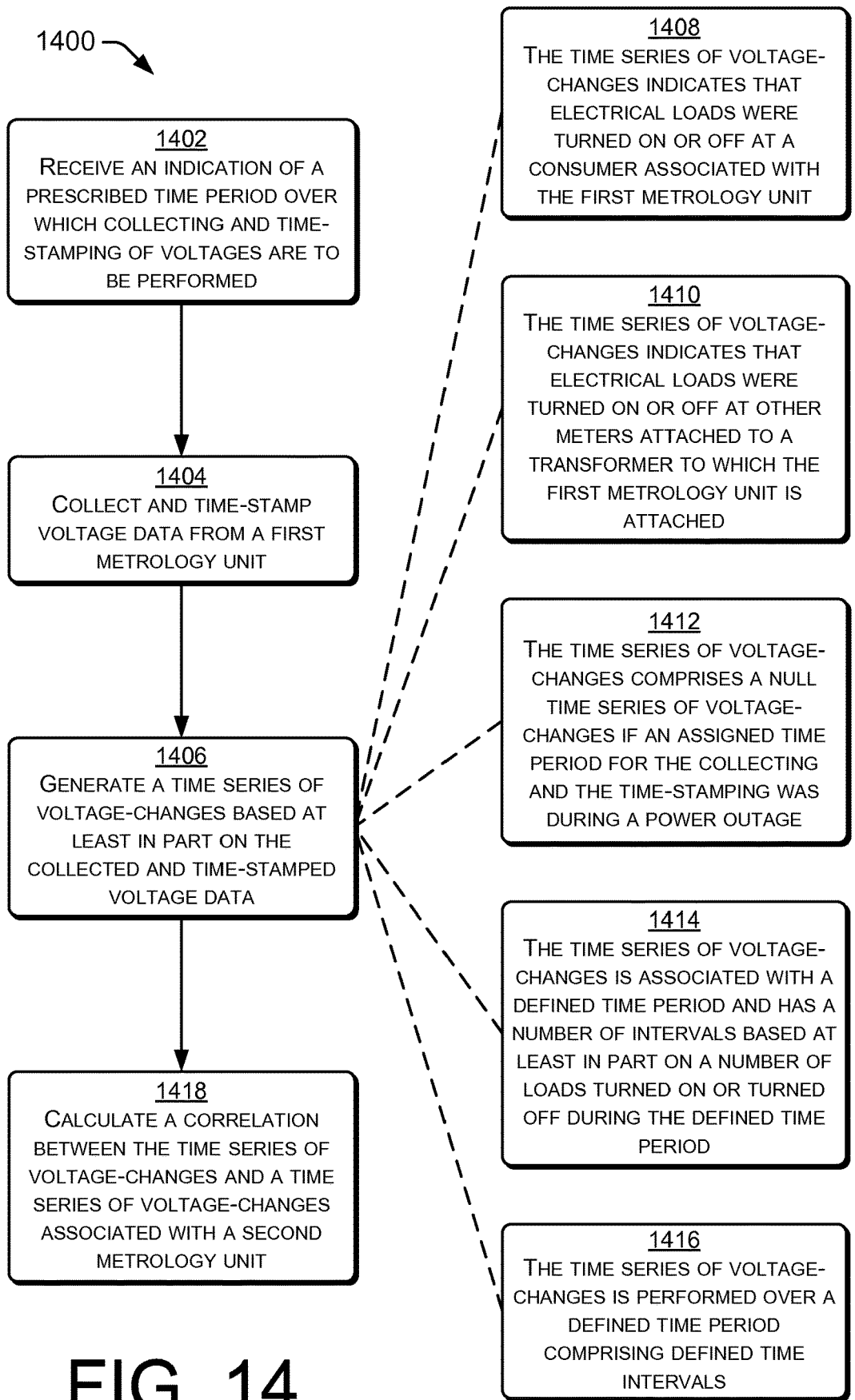
FIG. 14 is a flowchart showing a third example method by which the topology of a smart grid may be estimated.

FIGS. 12-14 are flow diagrams showing an example processes which are representative of techniques for use to determine a topology of a smart grid, and more particularly to determine a transformer to which a meter is attached. The processes may, but need not necessarily, be implemented in whole or in part by the meter 134 of FIGS. 1-3 and/or the computing device 128 of FIGS. 1, 2 and 4. The processes are described with references to the meters and computing devices of FIGS. 1-4 for ease of understanding, but are not limited to use with these devices. Accordingly, the meters and computing devices described are capable of performing numerous other processes and the processes of FIGS. 12-14 may be implemented using numerous other meters.

FIG. 12 is a flowchart showing an example method 1200 by which the topology of a smart grid may be estimated, and particularly how a connection between transformer(s) and meter(s) may be estimated, determined and/or confirmed. In the example techniques described, time-stamped voltage data is collected from one or more meters, such as a first meter and a second meter, respectively. A time-series of voltage-changes is generated for each meter, such as the first and the second meters, using the time-stamped voltage data that was collected. A correlation or affinity is calculated between meters, e.g., a correlation is calculated between the time-series of voltage-changes of the first meter and the time-series of voltage-changes of the second meter. Using the correlation, it may be determined if the first and second meters are connected to a same transformer.

At block 1202, time-stamped voltage data is collected from one or more meters. The voltage data may indicate a voltage "seen" by the meter or provided to the meter. The voltage may fluctuate based in part on voltage provided by an electrical grid (medium voltage transmission lines, etc.) and the load or consumption of power in a particular area. E.g., greater consumption of power may pull down voltages levels in a particular area. In the context of the system of FIG. 1, the time-stamped voltage data may be collected from all of the meters within not only the transformer service area 102, but also the entire extended service area 150. By collecting time-stamped voltage levels in the extended service area 150, it is possible that a meter can be detected that is actually connected to transformer 106, but which recordkeeping indicates is connected to transformer 130. In the context of the system of FIG. 2, the time-stamped voltage data may be collected by the metrology unit 206 of the example meter 134. The metrology unit 206 is configured to measure and time-stamp voltages provided by the transformer (106 or 130).

At block 1204, a time-series of voltage-changes is calculated or generated for each meter. The time-series of voltage-changes may be based at least in part on times at which appliances were turned on or off at any customer on a same transformer to which the metrology unit is attached. The calculation of the time-series of voltage-changes may be performed using the collected time-stamped voltage data obtained at block 1202. In the context of the example of the meter 134 of FIG. 2, the time-series function 212 calculates or derives the time-series of voltage-changes using the time-stamped voltage measurements from the metrology unit 206.

At block 1206, a correlation between the time-series of voltage-changes of two or more meters (e.g., the first and second meters of block 1202) is calculated. The calculation of the correlation may be performed on a particular meter or may be performed on a server or other computing device at a remote location. In an example of the former, shown at FIG. 3, a meter 300 may maintain a time-series database 302 containing time-series data from a number of meters. An example of such meters may include those within an extended service area 150 (an example of which is seen at FIG. 1) of a transformer. In the example of FIG. 3, the calculation of the correlation between the time-series of voltage-changes from different meters may be performed by the correlation module 304, which performs the calculation of the statistical correlation between two meters based on the time-series of voltage-changes of each. In the contact of the example of FIG. 4, the correlation module 304 may be located on a server or other computing device, which may be located within a office of a utility company or on a device on, or in communication with, the smart grid.

At block 1208, the calculation of the correlation may be performed only if the first meter and the second meter are physically close enough to each other to be within a extended service area of the same transformer. In this example, significant savings of resources may be obtained by limiting the calculation of correlations to include only those between meters that are sufficiently close to each other that it is possible that they are connected to the same transformer. Meters that are not within the same extended transformer service area of any single transformer would correlate only by accident, and such correlation might introduce errors into efforts to learn the topology of the smart grid.

At block 1210, particular optional techniques that may be used in calculating a correlation between two time-series of voltage-changes are described. In the example shown, the times of voltage-changes in the time-series of voltage-changes in the first meter and times of voltage-changes the time-series of voltage-changes of the second meter are synchronized and/or aligned. More particularly, each time-series of voltage-changes may have different times in the time-stamping and voltage-measuring process when the voltage changed and different times when the voltage did not change. Thus, a correlation between the voltages changes in two time-series of voltage-changes may be performed. The more that the times of change and the times of lack of change match, between any two meters, the more correlation there is between the two meters.

At block 1212, whether the two meters are connected to a same transformer may be determined, based on the calculated correlation. Generally high correlation or correlation over a threshold value indicates correlation and/or connection to the same transformer, while low correlation or correlation below a threshold (the same or different threshold) indicates lack of correlation and/or connection to different transformers. FIG. 13 provides additional techniques for use in making this determination.

At block 1214, whether a same wiring connection is used to connect two meters to the same transformer may also be based at least in part on the calculated correlation. In some techniques, a higher correlation between the time-series of voltage-changes between two meters may indicate the use of at least some common wiring to connect the two meters to the same transformer.

At block 1216, topological data may be generated or configured to show a relationship between the first and second meters. Example relationships include: connected to the same transformer using some common wiring; connected to the same transformer perhaps using distinct wiring; or connected to a different transformer). The topological data may be maintained in graphical form, tabular form, a database, spreadsheet or other data structure of information device.

FIG. 13 is a flowchart showing a second example method 1300 by which a true transformer to which a meter is connected may be estimated, determined and/or confirmed. In one example of the techniques, according to an assumed topology (e.g., as understood by recordkeeping of a utility company) each meter is connected to a transformer. A correlation or affinity may be calculated for a particular meter with respect to time-series of voltage-changes of other meters also thought to be connected to the same transformer. The highest of correlations of the particular meter with all other meters thought to be connected to the same transformer may be considered a "home affinity." Additionally, a correlation or affinity may be calculated for the particular meter with respect to time-series of voltage-changes of other meters not thought to be connected to the same transformer, but within a reasonable distance so that such connection is possible. The highest of correlations of the particular meter with all other meters not thought to be connected to the same transformer, but close enough to possibly be connected to the same transformer may be considered a "away affinity." If the home affinity of the particular meter is greater than the away affinity for the particular meter, than the assumed topology is confirmed. However, if the home affinity of the particular meter is less than the away affinity for the particular meter, than the assumed topology is suspect. In two examples, suspect topology may be investigated physically or flagged in a database.

At block 1302, a home affinity is determined to be a greatest correlation between a first meter and each meter recorded as connected to the same transformer as the first meter. Such recording may be in recordkeeping of a utility company. At block 1304, an away affinity is determined to be a greatest correlation between the first meter and each meter recorded as not connected to the same transformer but within an extended service area of the same transformer. At block 1306, the home affinity and the away affinity are compared. At block 1308, based on the comparison, it may be determined whether the first and second meters are connected to the same transformer. If the comparison indicated that the away affinity is greater than the home affinity, action may be taken. For example, a database or topology may be flagged, or a team may be sent into the field to investigate the connection.

FIG. 14 is a flowchart showing a third example method 1400 by which the topology of a smart grid may be estimated. At block 1402, an indication of a prescribed time period is received. During the prescribed time period, a plurality of meters collect and time-stamp of voltages levels. Thus, the correlation and/or affinity between meters are based on voltage measurements taken over a same period of time. That period of time may be dictated by a head office or other controlling entity. Alternatively, a same default time period may be programmed into each meter. At block 1404, voltage data may be collected and time-stamped from a first metrology unit. In some example systems, this data may be obtained by a remote server or computing device for processing. At block 1406, a time-series of voltage-changes is generated for a first meter. The time-series of voltage-changes may be based at least in part on the collected and time-stamped voltage data collected at block 1404. In some example systems, the time-series of voltage-changes may be generated by a remote server or computing device using the time-stamped voltage data.

Blocks 1408 through 1416 describe techniques related to the generation of the time-series of voltage-changes described at block 1406. In the example of block 1408, the time-series of voltage-changes may indicate that electrical loads were turned on or off at a consumer associated with the first metrology unit. In an example, if a load (e.g., an electric heater) at the meter turns on at a particular time, which may create a slight voltage dip at that time. Accordingly, the time-series of voltage-changes may indicate that electrical loads were turned on or off at a consumer to which the meter is attached. In the example of block 1410, the time-series of voltage-changes may indicate that electrical loads were turned on or off at other meters attached to a transformer to which the first metrology unit is attached. Thus, if a meter is attached to a same transformer as another meter, consumers turning on and off electrical loads may influence the voltage "seen" at any meter attached to the transformer. In the example of block 1412, the time-series of voltage-changes may be configured as a null time-series of voltage-changes if an assigned time period for the collecting and the time-stamping was during a power outage. If one meter experienced a blackout or power outage, and another meter had power at that time, it is unlikely that both meters share a transformer. An exception may be if a tree or other hazard brought down the feed to a meter from the transformer. In the example of block 1414, the time-series of voltage-changes is associated with a defined time period and has a number of intervals based at least in part on a number of loads turned on or turned off during the defined time period. That is, a voltage change (such as caused by a change in electrical load) could trigger the end of one interval and the start of another interval. In the example of block 1416, the time-series of voltage-changes may be performed over a defined time period comprising defined time intervals. Thus, the techniques of blocks 1414 or 1416 provide alternative methods by which intervals may be defined.

At block 1418, a correlation may be calculated between the time-series of voltage-changes of a first meter or metrology unit and a time-series of voltage-changes associated with a second meter or metrology unit.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method, comprising:
    measuring voltage at a first metrology unit of a first electricity meter within a smart electrical grid;
    collecting and time-stamping measured voltage data from the first metrology unit of the first electricity meter within the smart electrical grid;
    generating a time-series of voltage-changes based at least in part on the collected and time-stamped voltage data, wherein the time-series of voltage-changes indicates load changes detected by the first metrology unit and indicates load changes detected by other metrology units, wherein the time-series of voltage-changes has a number of intervals based at least in part on a number of loads turned on or turned off during the collecting and time-stamping and detected by the first metrology unit, and wherein the time-series of voltage-changes of the first metrology unit comprises intervals that have at least one of a start or an end at a change in electrical load detected by the first metrology unit;
    calculating a correlation between the time-series of voltage-changes and a second time-series of voltage-changes based on voltage data detected by a second metrology unit of a second electricity meter, wherein the calculating the correlation between the time-series of voltage-changes of the first electricity meter and the second time-series of voltage-changes of the second electricity meter is performed based at least in part on the first electricity meter and the second electricity meter being physically close enough to each other to be within an extended service area of a transformer; and
    determining if the first electricity meter and the second electricity meter are both connected to the transformer, based at least in part on the calculated correlation.

2. The method of claim 1, wherein:
    the time-series of voltage-changes indicates that some electrical loads were turned on or off by a consumer associated with the first metrology unit; and
    the time-series of voltage-changes indicates that other electrical loads were turned on or off at other meters associated with the transformer to which the first metrology unit is associated.

3. The method of claim 1, additionally comprising:
    receiving an indication of a prescribed time period over which the collecting and the time-stamping are to be performed.

4. The method of claim 1, wherein the time-series of voltage-changes comprises a null time-series of voltage-changes if an assigned time period for the collecting and the time-stamping was during a power outage.

5. The method of claim 1, wherein the generating of the time-series of voltage-changes is based at least in part on times at which appliances were turned on or off at any customer on a same transformer to which the first metrology unit is attached.

6. The method of claim 1, wherein calculating the correlation comprises:
    determining a degree to which times of voltage-changes in the time-series of voltage-changes of the first electricity meter correlate with times of voltage-changes in the second time-series of voltage-changes of the second electricity meter.

7. The method of claim 1, additionally comprising:
    generating topological data to show a relationship between the first electricity meter and the second electricity meter responsive to determining that the first electricity meter and the second electricity meter are both connected to the transformer.

8. The method of claim 1, additionally comprising:
    determining a home affinity as a greatest correlation from among correlations between the first electricity meter and each meter thought to be connected to the transformer; and
    determining an away affinity as a greatest correlation from among correlations between the first electricity meter and each meter thought to not be connected to the transformer, but within the extended service area of the transformer;
    wherein the determining if the first electricity meter and the second electricity meter are both connected to the transformer is additionally based on:
        comparing the home affinity and the away affinity; and
        determining, based on the comparison, whether the first electricity meter and the second electricity meter are connected to the transformer.

9. The method of claim 1, wherein at least some of the generating of the time-series of voltage-changes is performed by the first electricity meter and at least some of generating of the second time-series of voltage-changes is performed by the second electricity meter.

10. One or more computer-readable media storing computer-executable instructions that, when executed by one or more processors, configure a computing device to perform acts comprising:
    measuring voltage at a first metrology unit of a first electricity meter within a smart electrical grid;
    collecting and time-stamping measured voltage data from the first metrology unit of the first electricity meter within the smart electrical grid;
    generating a time-series of voltage-changes based at least in part on the collected and time-stamped voltage data, wherein the time-series of voltage-changes indicates load changes detected by the first metrology unit and indicates load changes detected by other metrology units, wherein the time-series of voltage-changes has a number of intervals based at least in part on a number of loads turned on or turned off during the collecting and time-stamping and detected by the first metrology unit, and wherein the time-series of voltage-changes of the first metrology unit comprises intervals that have at least one of a start or an end at a change in electrical load detected by the first metrology unit;

calculating a correlation between the time-series of voltage-changes and a second time-series of voltage-changes based on voltage data detected by a second metrology unit of a second electricity meter, wherein the calculating the correlation between the time-series of voltage-changes of the first electricity meter and the second time-series of voltage-changes of the second electricity meter is performed based at least in part on the first electricity meter and the second electricity meter being physically close enough to each other to be within an extended service area of a transformer; and determining if the first electricity meter and the second electricity meter are both connected to the transformer, based at least in part on the calculated correlation.

11. One or more computer-readable media as recited in claim 10, wherein:
the time-series of voltage-changes indicates that some electrical loads were turned on or off by a consumer associated with the first metrology unit; and
the time-series of voltage-changes indicates that other electrical loads were turned on or off at other meters associated with the transformer to which the first metrology unit is associated.

12. One or more computer-readable media as recited in claim 10, wherein the acts additionally comprise:
receiving an indication of a prescribed time period over which the collecting and the time-stamping are to be performed.

13. One or more computer-readable media as recited in claim 10, wherein the time-series of voltage-changes comprises a null time-series of voltage-changes if an assigned time period for the collecting and the time-stamping was during a power outage.

14. One or more computer-readable media as recited in claim 10, wherein the generating of the time-series of voltage-changes is based at least in part on times at which appliances were turned on or off at any customer on a same transformer to which the first metrology unit is attached.

15. One or more computer-readable media as recited in claim 10, wherein calculating the correlation comprises:
determining a degree to which times of voltage-changes in the time-series of voltage-changes of the first electricity meter correlate with times of voltage-changes in the second time-series of voltage-changes of the second electricity meter.

16. One or more computer-readable media as recited in claim 10, wherein the acts additionally comprise:
generating topological data to show a relationship between the first electricity meter and the second electricity meter responsive to determining that the first electricity meter and the second electricity meter are both connected to the transformer.

17. One or more computer-readable media as recited in claim 10, wherein the acts additionally comprise:
determining a home affinity as a greatest correlation from among correlations between the first electricity meter and each meter thought to be connected to the transformer; and
determining an away affinity as a greatest correlation from among correlations between the first electricity meter and each meter thought to not be connected to the transformer, but within the extended service area of the transformer;
wherein the determining if the first electricity meter and the second electricity meter are both connected to the transformer is additionally based on:
comparing the home affinity and the away affinity; and
determining, based on the comparison, whether the first electricity meter and the second electricity meter are connected to the transformer.

18. One or more computer-readable media as recited in claim 10, wherein at least some of the generating of the time-series of voltage-changes is performed by the first electricity meter and at least some of generating of the second time-series of voltage-changes is performed by the second electricity meter.

* * * * *